United States Patent
Holmes et al.

(10) Patent No.: US 11,637,243 B2
(45) Date of Patent: Apr. 25, 2023

(54) FORMATION OF ALIGNED PERIODIC PATTERNS DURING THE CRYSTALLIZATION OF ORGANIC SEMICONDUCTOR THIN FILMS

(71) Applicant: Regents of the University of Minnesota, Minneapolis, MN (US)

(72) Inventors: Russell J. Holmes, Chanhassen, MN (US); John David Myers-Bangsund, Minneapolis, MN (US); Thomas Robert Fielitz, Midland, MI (US)

(73) Assignee: Regents of the University of Minnesota, Minneapolis, MN (US)

( * ) Notice: Subject to any disclaimer, the term of this patent is extended or adjusted under 35 U.S.C. 154(b) by 196 days.

(21) Appl. No.: 16/881,196

(22) Filed: May 22, 2020

(65) Prior Publication Data
US 2020/0373491 A1 Nov. 26, 2020

Related U.S. Application Data

(60) Provisional application No. 62/851,709, filed on May 23, 2019.

(51) Int. Cl.
*H01L 51/00* (2006.01)
*H01L 51/44* (2006.01)
(Continued)

(52) U.S. Cl.
CPC ...... *H01L 51/0026* (2013.01); *H01L 51/0014* (2013.01); *H01L 51/447* (2013.01);
(Continued)

(58) Field of Classification Search
CPC ............. H01L 51/0026; H01L 51/0014; H01L 51/447; H01L 51/5262
See application file for complete search history.

(56) References Cited

U.S. PATENT DOCUMENTS 9,012,892 B2 * 4/2015 Chen ................ H01L 51/0005
 438/34
9,960,386 B2 5/2018 Thompson et al.
(Continued)

FOREIGN PATENT DOCUMENTS

JP 2012-123998 6/2012
KR 10-2004-0105320 12/2004

OTHER PUBLICATIONS

Reyes-Martinez, Marcos A., "Mechanical and Electro-Mechanical Properties of Crystalline Organic Semiconductors" (2015). Doctoral Dissertations. 395 (Year: 2015).*
(Continued)

*Primary Examiner* — Aaron J Gray
(74) *Attorney, Agent, or Firm* — Dicke, Billig & Czaja, PLLC

(57) ABSTRACT

Self-organizing patterns with micrometer-scale feature sizes are promising for the large area fabrication of photonic devices and scattering layers in optoelectronics. Pattern formation would ideally occur in the active semiconductor to avoid the need for further processing steps. The present disclosure includes approaches to form period patterns in single layers of organic semiconductors by an annealing process. When heated, a crystallization front propagates across the film, producing a sinusoidal surface structure with wavelengths comparable to that of near-infrared light. These surface features form initially in the amorphous region within a micron of the crystal growth front, likely due to competition between crystal growth and surface mass transport. The pattern wavelength can be tuned by varying film thickness and annealing temperature, millimeter scale domain sizes are obtained. Aspects of the disclosure can be exploited for self-assembly of microstructured organic optoelectronic devices, for example.

12 Claims, 21 Drawing Sheets

(51) Int. Cl.
  *H01L 51/52* (2006.01)
  *H01S 5/125* (2006.01)
  *H01S 5/36* (2006.01)
(52) U.S. Cl.
  CPC ........ *H01L 51/5262* (2013.01); *H01L 51/006* (2013.01); *H01L 51/0054* (2013.01); *H01L 51/0058* (2013.01); *H01L 51/0072* (2013.01); *H01S 5/125* (2013.01); *H01S 5/36* (2013.01)

(56) References Cited

U.S. PATENT DOCUMENTS

| | | | | |
|---|---|---|---|---|
| 2004/0113098 | A1* | 6/2004 | Vardeny | G02B 6/13 |
| | | | | 430/312 |
| 2004/0163758 | A1 | 8/2004 | Kagan et al. | |
| 2012/0025172 | A1 | 2/2012 | Smigelski, Jr. et al. | |
| 2016/0327695 | A1* | 11/2016 | Masuyama | B29C 33/424 |
| 2018/0219182 | A1 | 8/2018 | Thompson et al. | |

OTHER PUBLICATIONS

Fielitz, Thomas Robert, "Understanding and Engineering Molecular Order in Organic Semiconductors," Dissertation, University of Minnesota, pp. 514 (2017) (Year: 2017).*

Schweikart, A., Horn, A., Böker, A. & Fery, A. "Controlled Wrinkling as a Novel Method for the Fabrication of Patterned Surfaces," in Complex Macromolecular Systems, I 75-99 (Springer, Berlin, Heidelberg, 2009).

Chung, J. Y., Nolte, A. J. & Stafford, C. M. "Surface Wrinkling: A Versatile Platform for Measuring Thin-Film Properties," Adv. Mater., 23, 349-368 (2011).

Li, B., Cao, Y.-P., Feng, X.-Q. & Gao, H. "Mechanics of morphological instabilities and surface wrinkling in soft materials: a review," Soft Matter, 8, 5728-5745 (2012).

del Campo, A. & Arzt, E. "Fabrication Approaches for Generating Complex Micro—and Nanopatterns on Polymeric Surfaces," Chem. Rev., 108, 911-945 (2008).

Mei, Y., Kiravittaya, S., Harazim, S. & Schmidt, O. G. "Principles and applications of micro and nanoscale wrinkles," Mater. Sci. Eng. R Rep., 70, 209-224 (2010).

Kim, J. B. et al. "Wrinkles and deep folds as photonic structures in photovoltaics," Nat. Photonics, 6, 327-332 (2012).

Bowden, N., Huck, W. T. S., Paul, K. E. & Whitesides, G. M. "The controlled formation of ordered, sinusoidal structures by plasma oxidation of an elastomeric polymer," Appl. Phys. Lett., 75, 2557-2559 (1999).

Suh, K. Y., Seo, S. M., Yoo, P. J. & Lee, H. H. "Formation of regular nanoscale undulations on a thin polymer film imprinted by a soft mold," J. Chem. Phys., 124, 024710 (2006).

Huang, R. "Kinetic wrinkling of an elastic film on a viscoelastic substrate," J. Mech. Phys. Solids, 53, 63-89 (2005).

Gruner, P., Artt, M. & Fuhrmann-lieker, T. "Surface Wrinkling Induced by Photofluidization of Low Molecular Azo Glasses," ChemPhysChem, 14, 424-430 (2013).

Koo, W. H. et al. "Light extraction from organic light-emitting diodes enhanced by spontaneously formed buckles," Nat. Photonics, 4, 222-226 (2010).

Fuchs, C. et al. "Quantitative allocation of Bragg scattering effects in highly efficient OLEDs fabricated on periodically corrugated substrates," Opt. Express, 21, No. 14, 16319-16330 (2013).

Fielitz, T. R., Phenicie, C. M. & Holmes, R. J. "Effects of Additives on Crystallization in Thin Organic Films," Cryst. Growth Des., 17, 4522-4526 (2017).

Fielitz, T. R. & Holmes, R. J. "Crystal Morphology and Growth in Annealed Rubrene Thin Films," Cryst. Growth Des., 16, 4720-4726 (2016).

Fusella, M. A. et al. "Use of an Underlayer for Large Area Crystallization of Rubrene Thin Films," Chem. Mater., 29, 6666-6673 (2017).

Yang, Fangxu et al., "2D Organic Materials for Optoelectronic Applications," Adv. Mater., Advance Science News, 30, pp. 1-27 (2018).

Thomschke, Michael, Inverted Organic Light Emitting Diodes, Optical and Electrical Device Improvement, Dissertation, Technische Universitat Dresden, pp. 199 (2012).

Bangsund, John S. et al., "Controlling Spontaneously Formed Periodic Patterns in Organic Semiconductor Thin Films," Department of Chemical Engineering and Materials Science, University of Minnesota, pp. 1 (Jun. 1, 2018).

Xu, Youyong et al., "Pattering of Conjugated Polymers for Organic Optoelectronic Device," Small, Reviews, Optoelectronics, 7, 10, pp. 1338-1360 (2011). <www.small-journal.com>.

Bommel, Sebastian, Unravelling nanoscale molecular processes in organic thin films, Dissertation, Humboldt-Universitat Zu Berlin, pp. 168 (2015).

Bangsund, John S. et al., "Formation of aligned periodic patterns during the crystallization of organic semiconductor thin films," Nature Materials, vol. 18, pp. 725-732 (Jul. 2019).

Fielitz, Thomas Robert, "Understanding and Engineering Molecular Order in Organic Semiconductors," Dissertation, University of Minnesota, pp. 514 (2017).

* cited by examiner

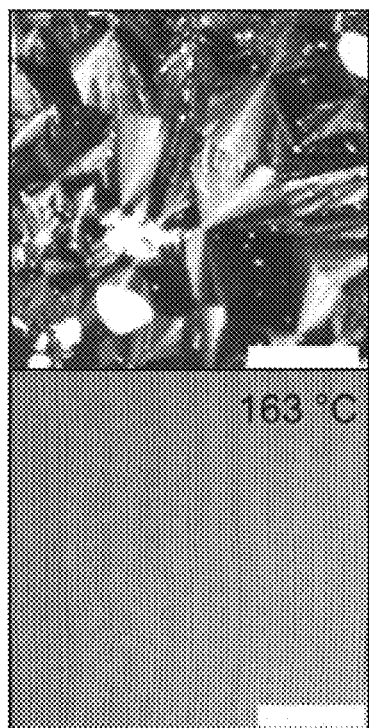
FIG. 1C
FIG. 1D
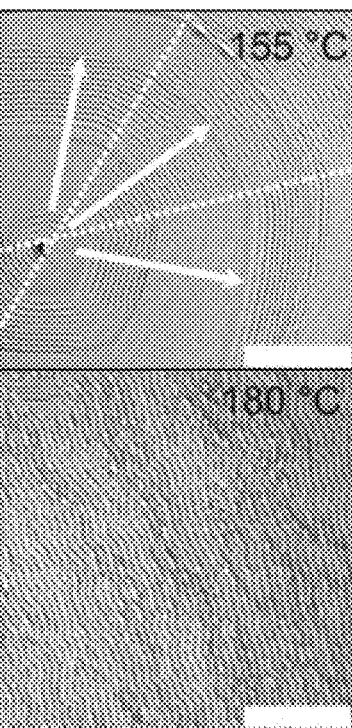
FIG. 1E
FIG. 1F FIG. 1G FIG. 1H
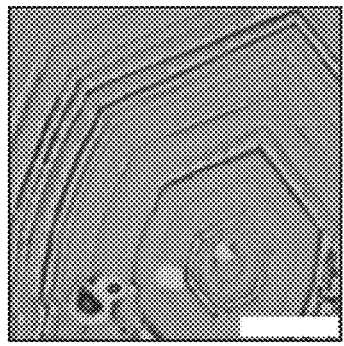
FIG. 1I
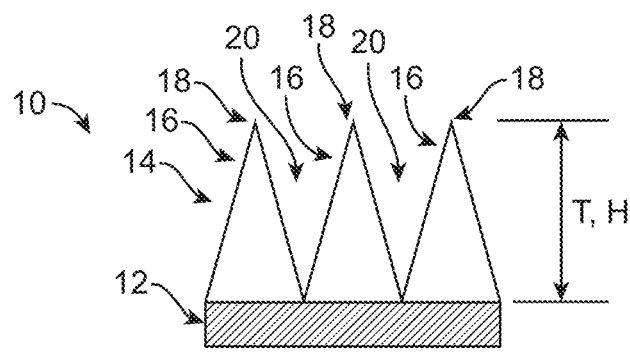
FIG. 1J

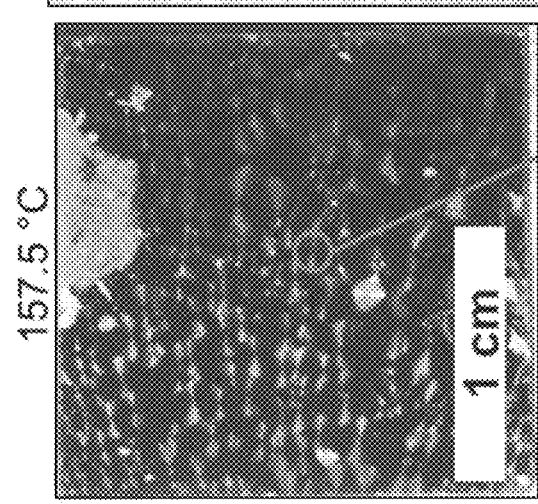
FIG. 1K 157.5 °C
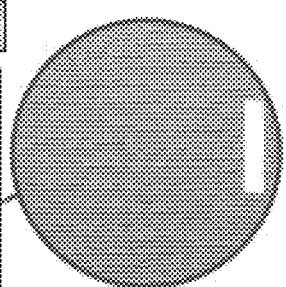
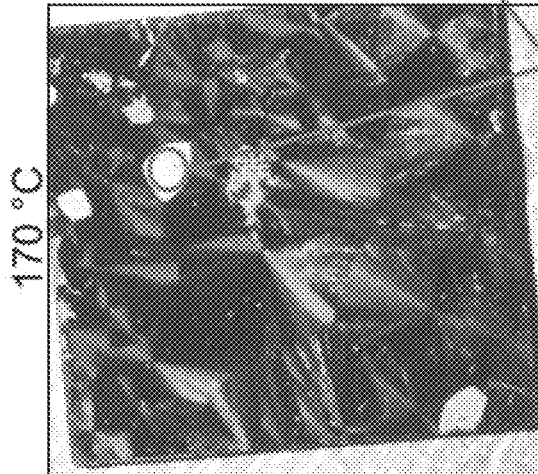
FIG. 1L 170 °C
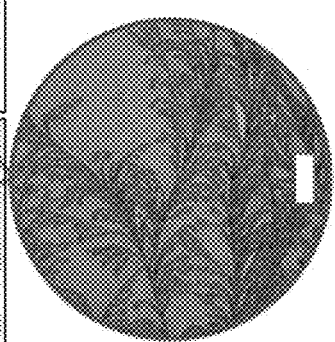
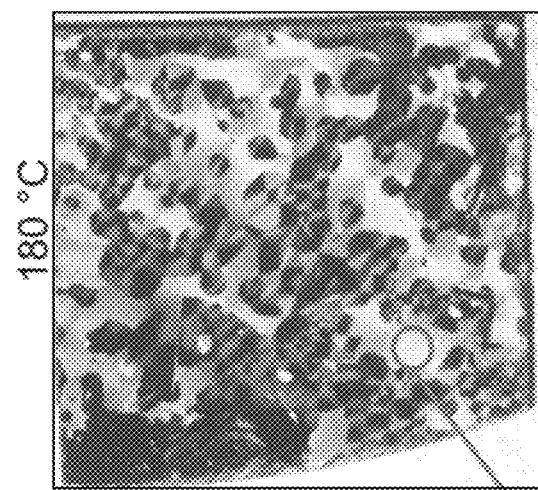
FIG. 1M 180 °C

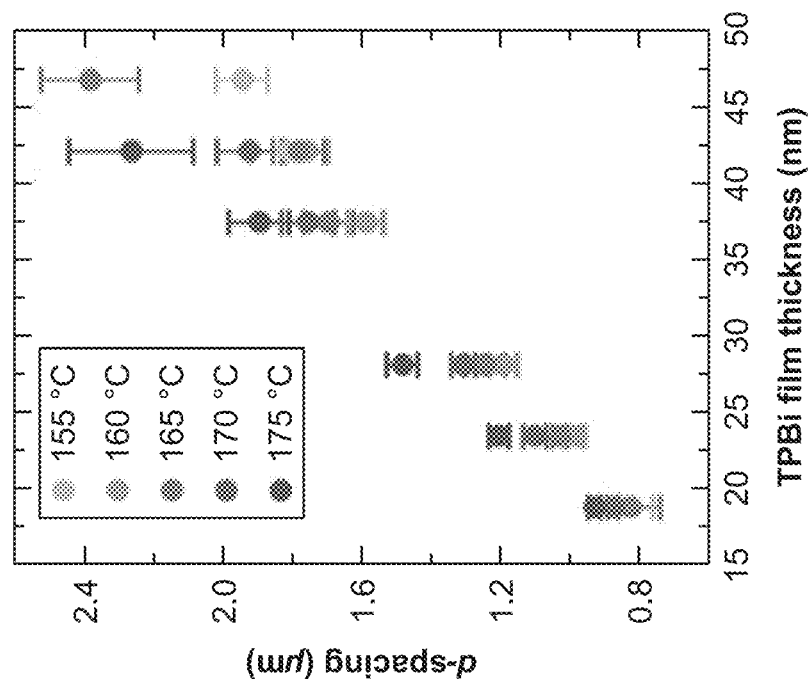
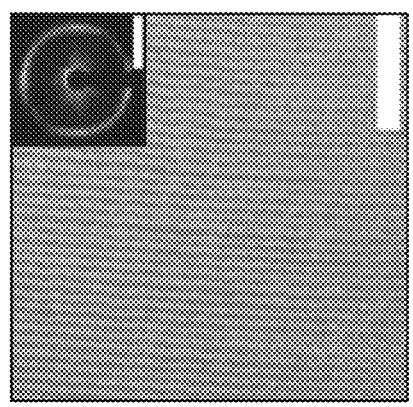
FIG. 2A
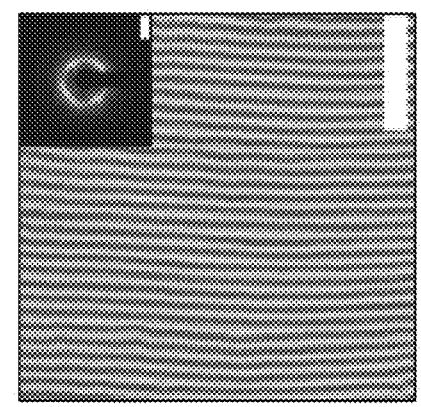
FIG. 2B
FIG. 2C

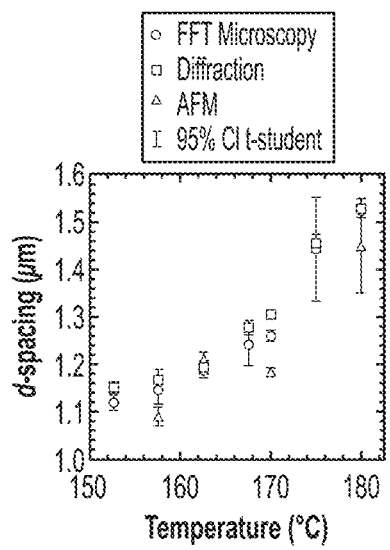
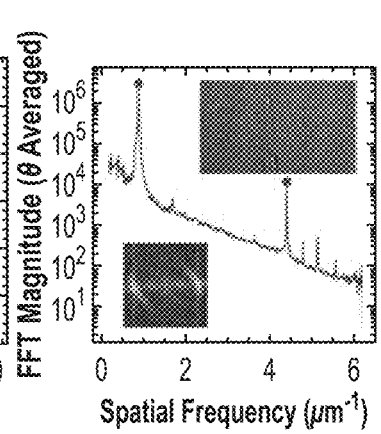
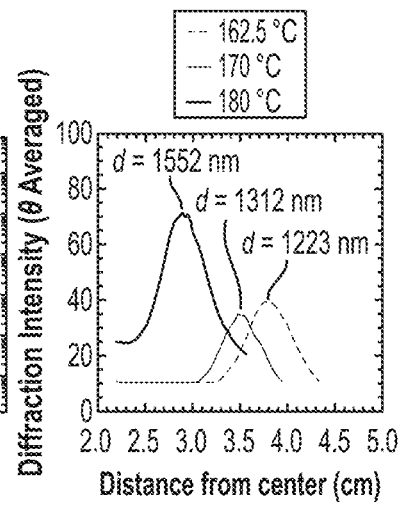
FIG. 2H  FIG. 2I  FIG. 2J
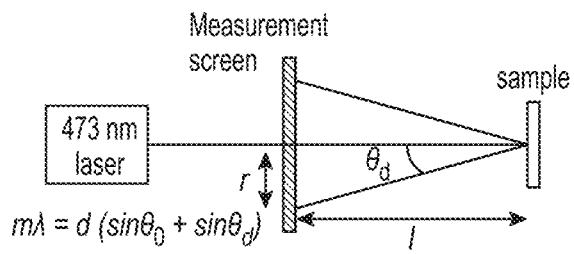
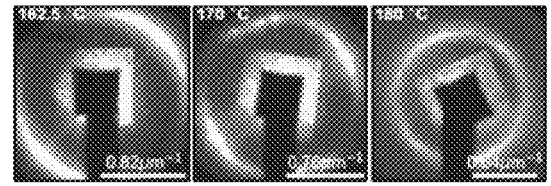
FIG. 2K  FIG. 2L
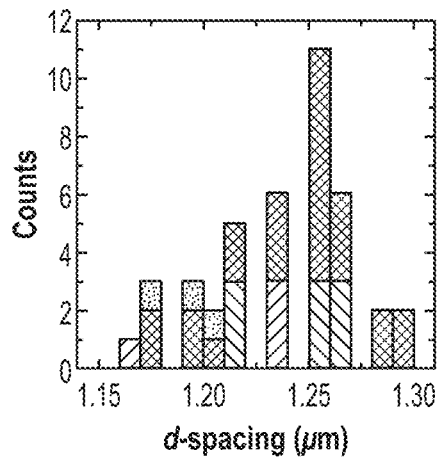
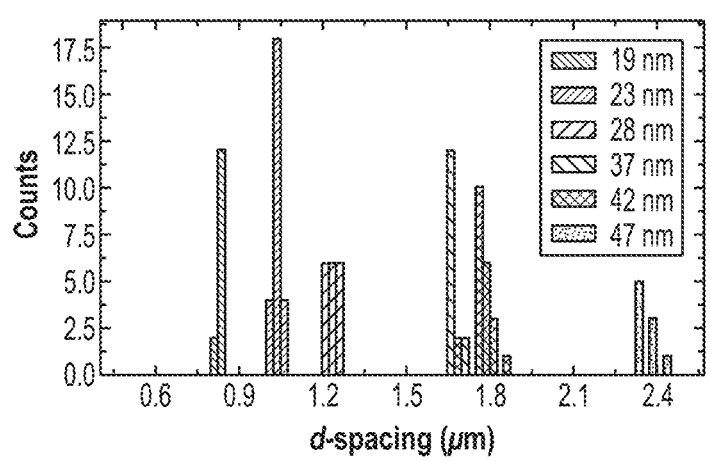
FIG. 2M  FIG. 2N

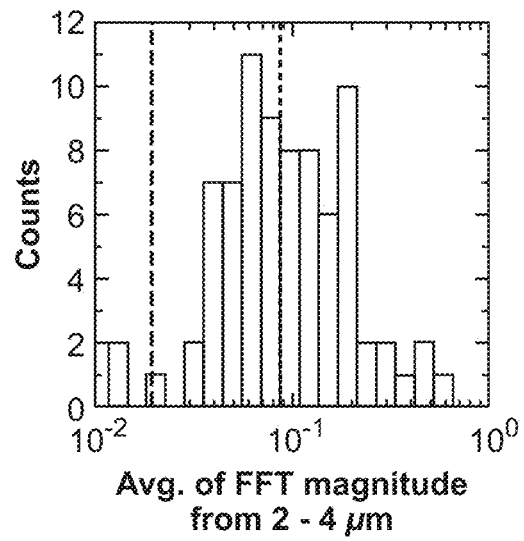
FIG. 2S
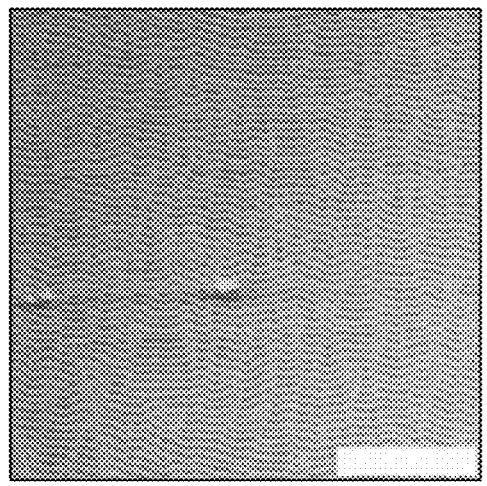
FIG. 2T
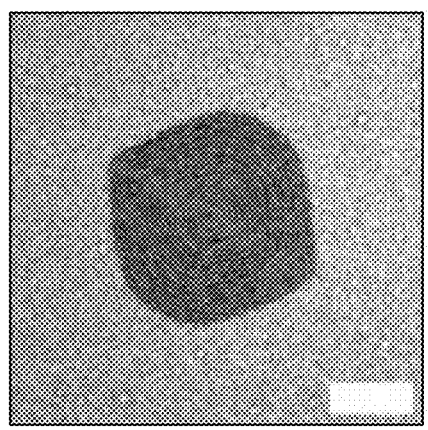
FIG. 3A
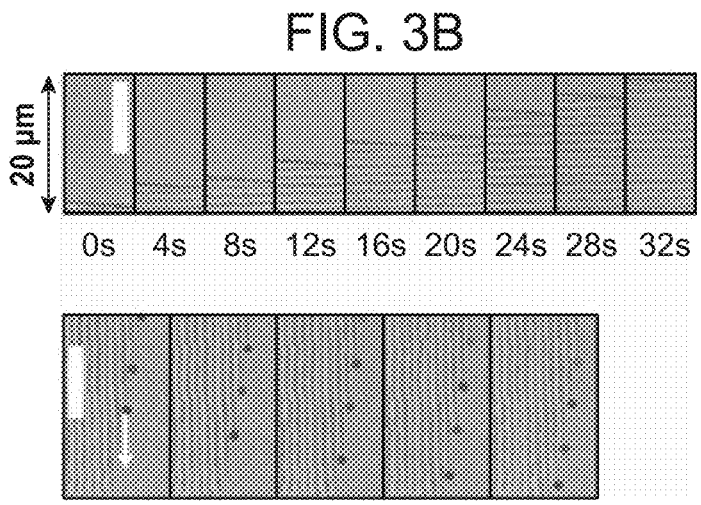
FIG. 3B
FIG. 3C

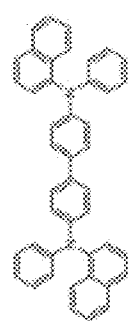
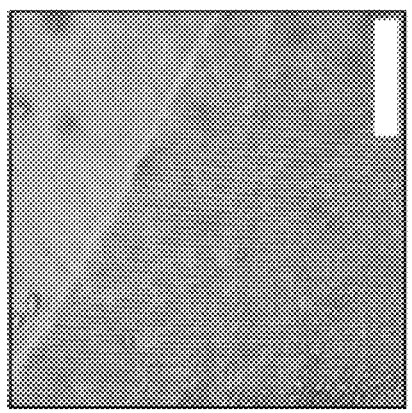
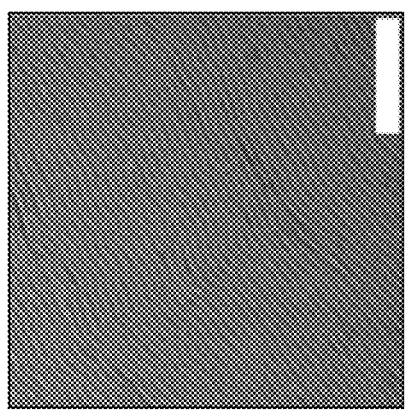
FIG. 5A
FIG. 5D
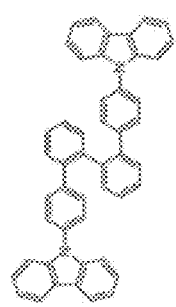
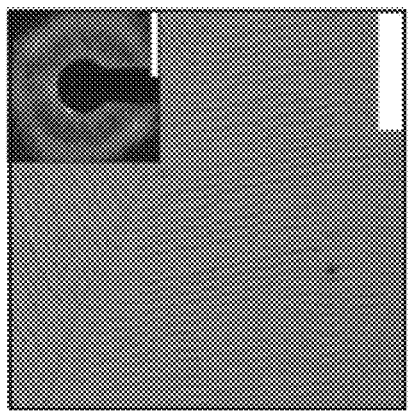
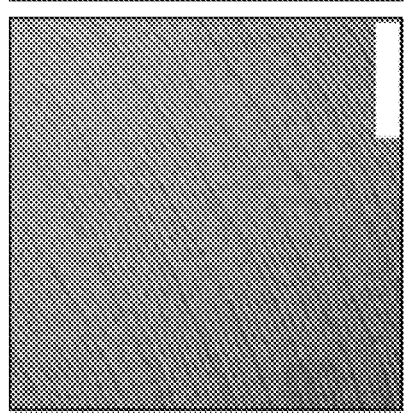
FIG. 5B
FIG. 5E
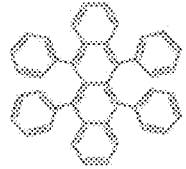
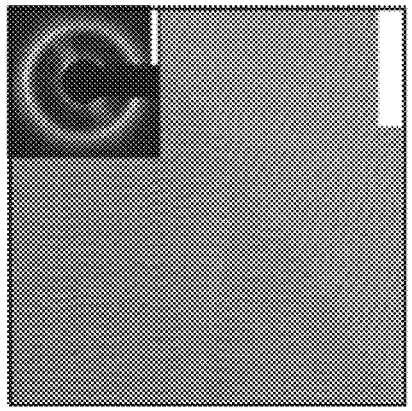
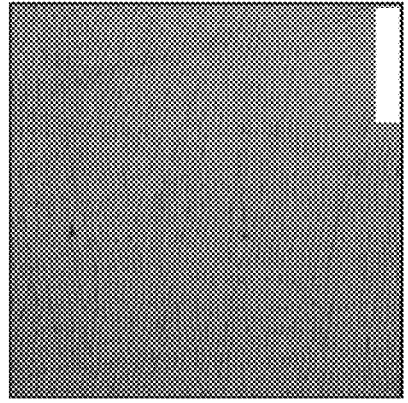
FIG. 5C
FIG. 5F

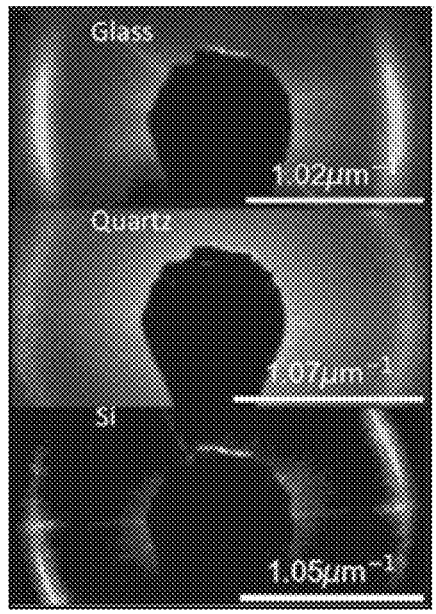 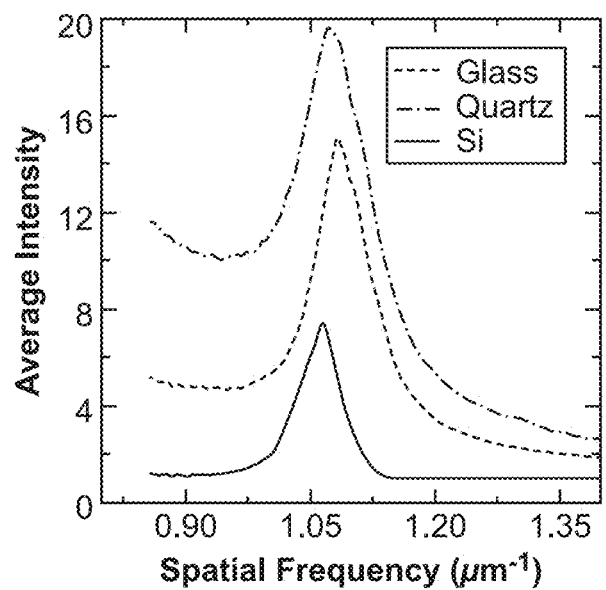
FIG. 5G  FIG. 5H
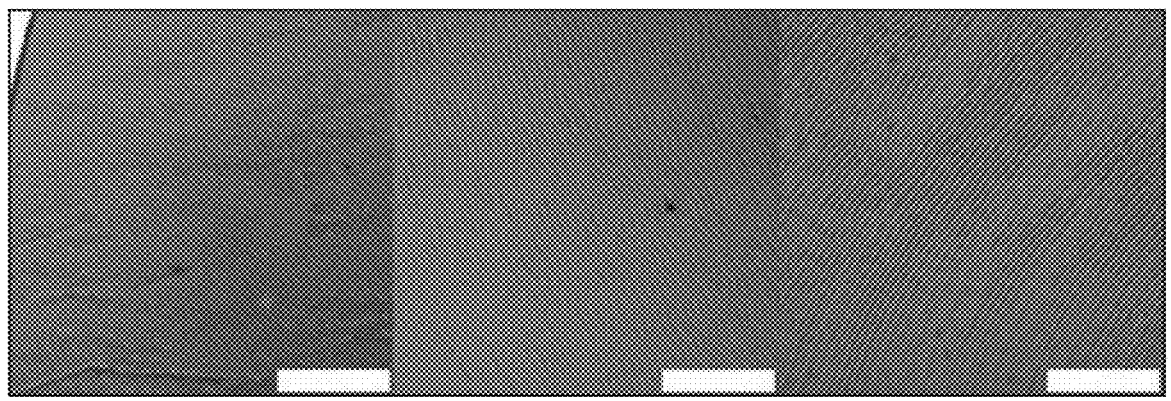
FIG. 5I  FIG. 5J  FIG. 5K

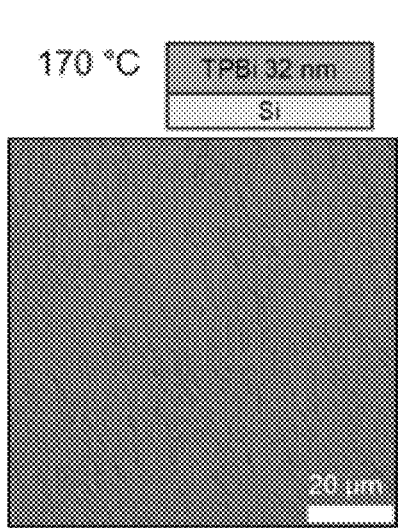
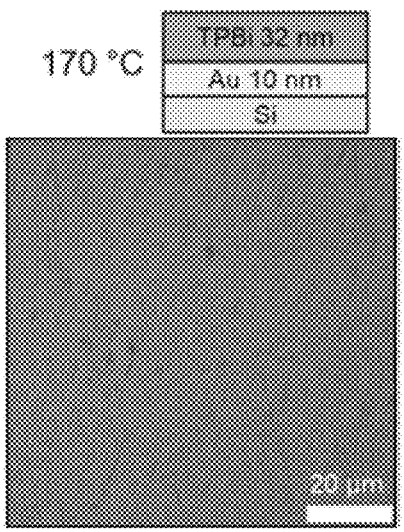
FIG. 6A  FIG. 6B
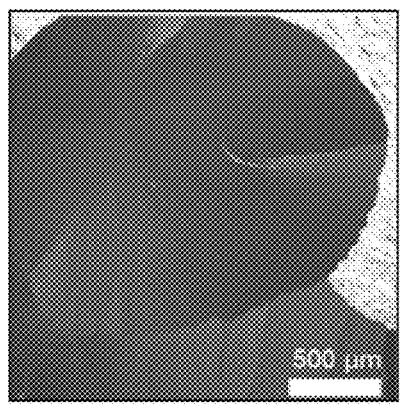
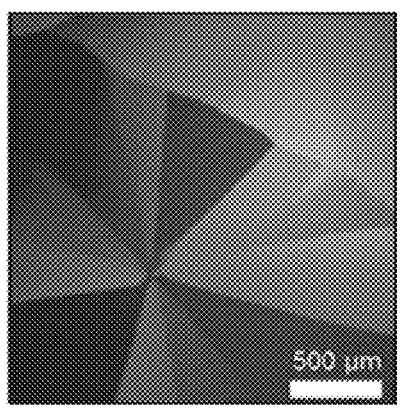
FIG. 6C  FIG. 6D
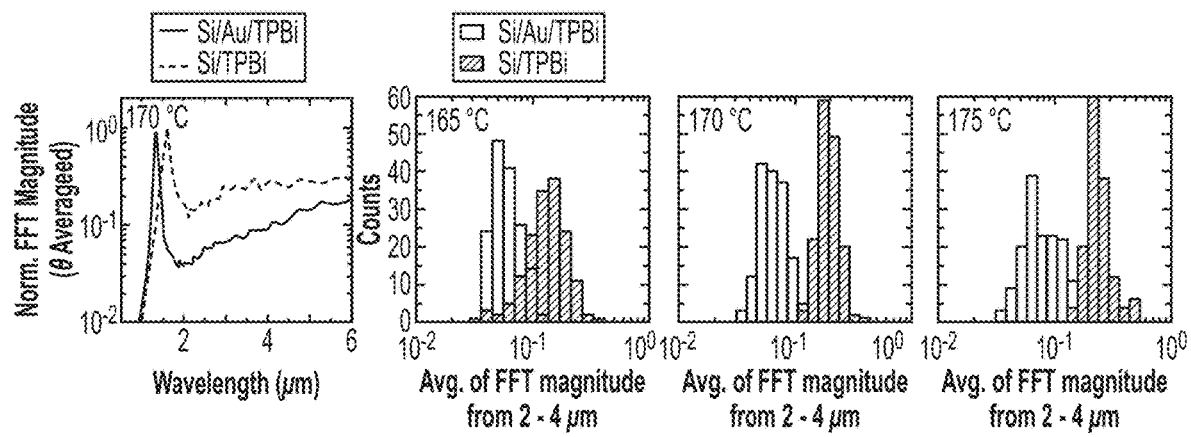
FIG. 7A  FIG. 7B  FIG. 7C  FIG. 7D

FORMATION OF ALIGNED PERIODIC PATTERNS DURING THE CRYSTALLIZATION OF ORGANIC SEMICONDUCTOR THIN FILMS

RELATED APPLICATIONS

This Non-Provisional patent application claims the benefit of the filing date of U.S. Provisional Patent Application Ser. No. 62/851,709, filed May 23, 2019, entitled "FORMATION OF ALIGNED PERIODIC PATTERNS DURING THE CRYSTALLIZATION OF ORGANIC SEMICONDUCTOR THIN FILMS," the entire teachings of which are incorporated herein by reference.

GOVERNMENT LICENSE RIGHTS

This invention was made with government support under DMR-1307066, DMR-1708177 and DGE-1348264 awarded by the National Science Foundation. The government has certain rights in the invention.

BACKGROUND

Organic semiconductor devices are often used in light-emitting diodes, solar cells, photodetectors, field-effect transistors, organic lasers, and electrochromics. Such organic semiconductor devices are generally less expensive to fabricate than traditional silicon-based semiconductor devices and are also more flexible and lightweight.

The present disclosure addresses problems and limitations associated with the related art.

BRIEF DESCRIPTION OF THE DRAWINGS

FIG. 1C is a macroscopic photo of optical diffraction from a 30-nm-thick TPBi film on a Si substrate annealed at 170° C. (The sample was illuminated by unpolarized white light at an oblique angle and it is noted that dark regions in FIG. 1C are due to the orientation of the corrugation relative to the illumination source and are diffractive at different viewing angles. The scale bar is 0.5 cm).

FIG. 1D is a cross-polarized optical micrograph of 30-nm-thick TPBi annealed at 170° C. showing a millimeter-scale crystalline grain (scale bar is 0.5 mm).

FIG. 1E is an unpolarized optical micrograph of 30-nm-thick TPBi film on Si substrate annealed at 155° C. with periodicity d=(1.20±0.05) μm (Arrows indicate the growth direction of three crystal facets from a single nucleation point. The slower-growing facets (top and bottom regions) show plateau regions without periodic topography. The scale bar is 20 μm).

FIG. 1F is an unpolarized optical micrograph of 30-nm-thick TPBi film on Si substrate annealed at 163° C. with d=(1.25±0.06) μm, showing exquisite alignment of the periodic ridges (Arrows indicate the growth direction of three crystal facets from a single nucleation point. The slower-growing facets (top and bottom regions) show plateau regions without periodic topography. The scale bar is 20 μm).

FIG. 1G is an unpolarized optical micrograph of 30-nm-thick TPBi film on Si substrate annealed at 175° C. with d=(1.48±0.05) μm (Arrows indicate the growth direction of three crystal facets from a single nucleation point. The slower-growing facets (top and bottom regions) show plateau regions without periodic topography. The scale bar is 20 μm).

FIG. 1H is an unpolarized optical micrograph of 30-nm-thick TPBi film on Si substrate annealed at 180° C. with d=(1.51±0.12) μm, showing a more disordered topography due to the higher growth rate at high temperatures (Arrows indicate the growth direction of three crystal facets from a single nucleation point. The slower-growing facets (top and bottom regions) show plateau regions without periodic topography. The scale bar is 20 μm).

FIG. 1I is an unpolarized optical micrograph of a 30-nm-thick TPBi film annealed at 145° C., showing formation of growth rings spaced at random intervals by flat crystalline regions (scale bar is 20 μm).

FIG. 1J is a partial, enlarged, a schematic illustration of the pattern formation shown in FIG. 1B.

FIGS. 1K-1M are macroscopic photos of a 30-nm-thick TPBi film on Si substrate annealed at 157.5° C., 170° C. and 180° C. (1 cm scale bar). Insets show unpolarized optical microscopy images of representative morphologies for the two crystalline phases which are observed. Scale bars are 20 μm in both insets. For samples annealed between 155 and 170° C., surface coverage of the corrugated, platelet-like crystal phase is >90%. At temperatures between 170-180° C., a dendritic phase becomes increasingly dominant, comprising 20-80% of the surface area. At temperatures below 155° C., the platelet like phase remains dominant, but growth rate slows sufficiently to reduce the surface coverage of the corrugated regions (see FIG. 1E and FIG. 1I). The color in the platelet-like grains is due to diffraction of the oblique illumination light source by the periodic patterns. These images illustrate that the periodic features have complete surface coverage in the platelet-like grains. Dark regions where diffraction is not visible are simply due to the orientation of the illumination light, and diffraction in these regions is evident upon rotating the samples.

FIG. 2A is an unpolarized optical micrograph of 25-nm-thick TPBi film on Si substrate annealed at 165° C. with periodicity d=(1.03±0.03) μm (scale bar is 10 μm and inset is a diffraction pattern produced by illuminating the sample with a λ=473 nm laser, with a scale bar of 1 μm$^{-1}$).

FIG. 2B is an unpolarized optical micrograph of 47-nm-thick TPBi film on Si substrate annealed at 165° C. showing d=(2.38±0.14) μm (scale bar is 10 μm and inset is a diffraction pattern with a scale bar of 0.47 μm$^{-1}$).

FIG. 2C is a graph illustration the dependence of pattern d-spacing on film thickness and temperature, as extracted from fast Fourier transforms of optical microscopy images (error bars are 95% confidence intervals using the Student's t-distribution for small sample sizes and averaged over at least ten images).

FIG. 2H is a graph illustrating pattern periodicity extracted from various measurement methods for a 30-nm-thick TPBi film on Si substrate. d-spacings extracted from AFM show slightly more variation than the other techniques due to the small sampling area of AFM images (100 µm$^2$) (Error bars are 95% confidence intervals using the Student's t-distribution for small sample sizes and averaged over at least ten images for measurements from optical microscopy and diffraction, and at least three images for measurements from AFM).

FIG. 2I is a graph illustrating azimuthally averaged radial profile of a 2D Fourier transform (lower left inset) of a 30-nm-thick TPBi film annealed at 165° C.

FIG. 2J is a graph illustrating azimuthally averaged radial profiles of diffraction images shown in FIG. 2I for 30-nm-thick TPBi films annealed at various temperatures.

FIG. 2K is a measurement schematic for diffraction images (The illuminated measurement screen is captured with a DSLR camera, and distances in the image are calibrated with a ruler. The laser spot size is approximately 1 mm in diameter.).

FIG. 2L includes diffraction images of 30-nm-thick TPBi films annealed at various temperatures (All images have the same dimensions. The square regions in the images are due to incoherently scattered waveguided light from the samples.).

FIG. 2M is a histogram of the pattern d-spacing for 30-nm-thick TPBi on Si annealed at 170° C. across multiple fabrication batches, wherein each color represents a separate batch.

FIG. 2N includes histograms of d-spacing as a function of TPBi film thickness for films on Si substrates annealed at 165° C. (The distributions in FIGS. 2M and 2N represent variability across the area of a single sample and are used to calculate the averages and confidence intervals in FIG. 2C. As described in herein, these d-spacings are extracted from the peak of azimuthally-averaged FFT power density spectra of optical microscopy images.).

(as shown in FIGS. 1G-1H). (Image areas are 0.04 mm$^2$ (234 µm×176 µm)).

FIG. 2S is a histogram of the average FFT magnitude from 2-4 µm for 80 images of 30 nm TPBi film annealed at 163° C. taken across samples from two separate deposition runs, including those in FIG. 2R. The area of each image is 0.005 mm$^2$. The dashed black line corresponds to the average FFT magnitude from 2-4 µm for the image in FIG. 1F. The dotted black line corresponds to the median pattern quality.

FIG. 2T is an image most representative of the median pattern quality (scale bar is 20 µm).

FIG. 3A is a cross-polarized optical micrograph of a single crystalline grain in a 30-nm-thick TPBi film during annealing at 165° C. and it can be seen that the grating pattern is aligned parallel to the growth front and is only observed within the crystallized region. The surrounding material with lower extinction is amorphous, showing no birefringence, unlike the crystalline grain (scale bar is 20 µm).

FIG. 3B is a time series of unpolarized optical micrographs during annealing of a 30-nm-thick TPBi film at 165° C., showing pattern formation along the boundary of the amorphous-to-crystalline transformation front which propagates at a rate of ~0.6 µm/s (time between frames is 4 seconds; scale bar is 10 µm; dashed lines indicate the edge of the crystalline growth front).

FIG. 3C is a time series of finer time-steps (1 second between frames) of the same region in FIG. 3B, showing individual ridges extending along the length of the growth front at a rate of ~3 µm/s (To guide the eye, colored circles are placed at endpoints of each individual ridge. Scale bar is 10 µm.).

FIG. 5A includes a molecular structure of α-NPD and polarized optical microscope image of pattern formation in a 30-nm-thick film of α-NPD on a Si substrate annealed at 170° C. with periodicity d=(0.98±0.05) μm (diffraction was not observable for α-NPD due to incomplete surface coverage of the pattern, with the majority of the film forming flat crystalline regions as shown in the upper right corner of the image in FIG. 5A).

FIG. 5B includes a molecular structure of BCBP and polarized optical microscope image of pattern formation in a 35-nm-thick film of BCBP on a Si substrate annealed at 170° C. with periodicity d=(1.6±0.1) μm (inset of FIG. 5B is a diffraction image of the film of FIG. 5B with a scale bar of 0.64 μm−1 and a physical width of 6.8 cm).

FIG. 5C includes the molecular structure of rubrene and polarized optical microscope image of pattern formation in a 30-nm-thick film of rubrene on a Si substrate annealed at 185° C. with periodicity d=(1.75±0.1) μm (inset of FIG. 5C is a diffraction image of the film of FIG. 5C with a scale bar of 0.57 μm−1 and a physical width of 6.8 cm).

FIG. 5D is an unpolarized optical microscope image of pattern formation of a 30-nm-thick TPBi film on a glass/indium tin oxide substrate annealed at 163° C. (scale bar is 20 μm).

FIG. 5E is an unpolarized optical microscope image of pattern formation of a 30-nm-thick TPBi film on a Si/Au substrate annealed at 163° C. (scale bar is 20 μm).

FIG. 5F is an unpolarized optical microscope image of pattern formation of a 30-nm-thick TPBi film on a Si/Ag substrate annealed at 163° C. (scale bar is 20 μm).

FIG. 5G is a collection of optical diffraction images illustrating substrate dependence of pattern formation in 20-nm-thick TPBi films annealed at 170° C. (Diffraction measurements with a λ=473 nm laser show that the pattern periodicity is within typical sample-to-sample variation across quartz, borosilicate glass, and Si substrates).

FIG. 5H is a graph illustrating substrate dependence of pattern formation in 20-nm-thick TPBi films annealed at 170° C. Diffraction measurements with a λ=473 nm laser show that the pattern periodicity is within typical sample-to-sample variation across quartz, borosilicate glass, and Si substrates.

FIG. 5I is an unpolarized optical micrograph of 28 nm TPBi film on Glass/ITO substrate annealed at 163° C., then coated with a 130-nm-thick OLED device stack (This image demonstrates that surface corrugation can propagate through a device stack, as there is minimal index contrast between the organic layers. The scale bar is 20 μm.).

FIG. 5J is an unpolarized optical micrograph of 33 nm TPBi film on $Al_2O_3$ substrate (A-plane) annealed at 165° C. (scale bar is 20 μm).

FIG. 5K is an unpolarized optical micrograph of 30 nm TPBi film on Si/$WO_3$ substrate (5 nm) annealed at 160° C. (The wavelength of the grating is slightly impacted by the surface chemistry, but the differences between these images arise in large part due to TPBi film thickness variation. The scale bar is 20 μm.).

FIG. 6A is an unpolarized optical micrograph of surface patterns in a 32-nm-thick TPBi film on Si substrate annealed at 170° C.

FIG. 6B is an unpolarized optical micrograph of surface patterns in a 32-nm-thick TPBi film deposited on Si substrate coated with 10 nm Au and annealed at 170° C. showing higher pattern quality as compared to that of FIG. 6A.

FIG. 6C is a polarized optical micrograph of the sample of FIG. 6A.

FIG. 6D is a polarized optical microphotograph of the sample of FIG. 6B, wherein the Au surface results in reduced crystal branching and smoother growth fronts. The dendritic morphology is also almost completely non-existent in the sample grown on an Au surface, suggesting that the surface properties can also impact crystal phase composition.

FIG. 7A is a graph illustrating azimuthally-averaged FFT power spectra for 32-nm-thick TPBi film samples on Si and Si/Au (10 nm) substrates annealed at 170° C. (the pattern wavelength is slightly reduced on an Au surface, and the pattern quality is significantly improved).

FIGS. 7B-7D are histograms of the average FFT magnitude from 2-4 μm for >150 images for each test condition, with images taken at random locations across each sample (The area of each image is 0.005 $mm^2$, and hence each histogram is sampled over ~0.7 $mm^2$ of the pattern. The pattern quality is systematically improved on the Au substrate, due to the reduced crystal growth rate and improved crystal morphology. This result illustrates that surface chemistry could be used to engineer pattern quality and wavelength.).

DETAILED DESCRIPTION

Figure 1A:
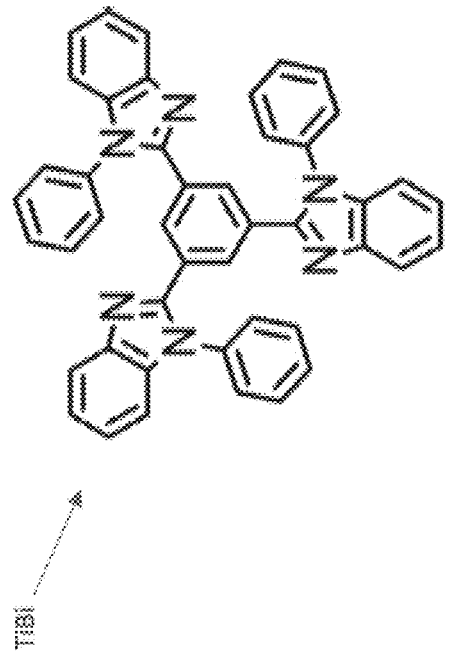
FIG. 1A is a diagram illustrating the molecular structure of TPBi.
Figure 1B:
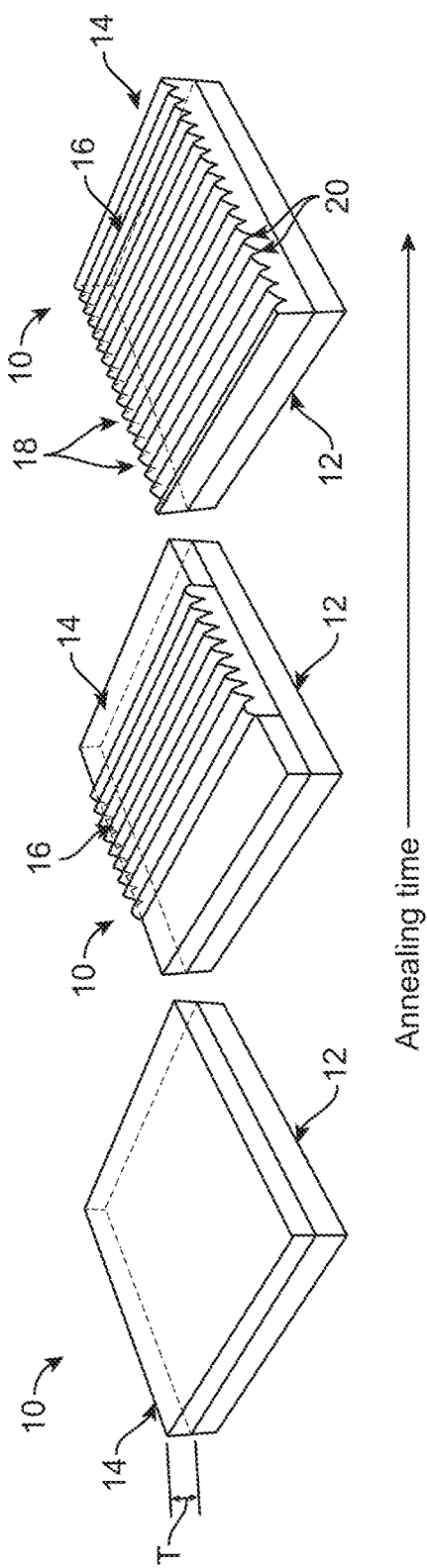
FIG. 1B is a schematic illustration of the amorphous (blue) to crystalline (orange) transformation which propagates across a TPBi film when annealed for several minutes at a temperature above 150° C., leading to large-area pattern formation.

Aspects of the disclosure relate to self-organizing patterns with micrometer-scale feature sizes for the large area fabrication of photonic devices and scattering layers in optoelectronics. Aspects of the disclosure relate to pattern formation in the active semiconductor to avoid the need for further processing steps. The present disclosure includes approaches to form periodic patterns in single or multiple layers of organic semiconductors by an annealing process. When heated, a crystallization front or surface features propagate across the film, producing a generally (but not exclusively) sinusoidal surface structure with wavelengths comparable to that of near-infrared light. These surface features form initially in the amorphous region within a micron of the crystal growth front, likely due to competition between crystal growth and surface mass transport. The pattern wavelength can be tuned, as desired, by varying film thickness and annealing temperature so that millimeter scale domain sizes are obtained. In some embodiments the pattern wavelength is 100 nm or more. In other embodiments, the pattern wavelength is tuned in a range from 300 nm to 2,400 nm. Aspects of the disclosure can be exploited for self-assembly of microstructured organic optoelectronic devices, for example.

Methods for spontaneously forming periodic surface structures/features at the nanometer or micrometer scale have received considerable attention for lithography-free patterning applications. Spontaneous pattern formation is attractive as it can be easily scaled to large areas, potentially enabling higher throughput and lower cost than serial processes. These self-assembly techniques have primarily exploited phase separation of block copolymers or strain-induced wrinkling of polymeric thin films. Block copolymers are effective for patterning sub-100-nm features, but are not amenable to create features on the length scale of visible light. Thin film wrinkling can form structures with periodicities ranging from ~400 nm-10 μm, and is hence suitable for optoelectronic and photonic applications in the visible and near-infrared region. While wrinkling approaches have afforded remarkable control and tunability over pattern formation, aligned patterns are more challenging to realize, and often require the application of anisotropic stress during film deposition or additional patterning. Further, these approaches rely on the use of multiple layers and often lack thermal stability.

Aspects of the disclosure include a crystallization-mediated mechanism in which aligned, periodic surface structures are formed along the amorphous-to-crystal transformation front during annealing of single-layer thin films of small molecule organic semiconductors. The observed topography originates in the form of material depletion and accumulation in the amorphous region within ~0.5 μm of the crystal front, likely due to mass-transport-limited crystal growth.

The present inventors have developed methods that result in devices having large-area pattern coverage with millimeter-scale single crystal domains, direct integration into single layers of organic semiconductors, feature depths which span nearly the entire film thickness, and pattern wavelengths which are tunable over a range useful for optoelectronic applications. In some embodiments, the feature depths span between about 50% and about 95% of the film thickness. In other embodiments, the feature depths span at least 80% of the film thickness. As desired, the periodicity of the observed wrinkling can be specifically tuned by varying film thickness and annealing temperature. In some embodiments, the periodicity is tuned to be 100 nm or more. In other embodiments, the periodicity is tuned in a range from 300 nm to 2,400 nm. Further, the resulting structures exhibit excellent thermal stability since they occur with a transition to a crystalline phase.

Since many organic semiconducting molecules form glasses when deposited and crystallize readily when annealed, it is envisioned that the disclosed methods of crystallization-mediated periodic patterning could be generalizable to a wide range of materials. Indeed, the present disclosure provides examples of pattern formulation in four archetypical organic semiconductors, however, it is believed that application of the principles of the disclosure can be applied in a variety of optoelectronic settings including the improvement of light trapping in solar cells or photodetectors, enhancing light extraction from emissive devices, and the fabrication of self-assembled organic lasers (see, for example, FIGS. 8-13B).

Formation and Tunability of Aligned Periodic Patterns

Generally, pattern formation of a device 10 is examined by annealing organic semiconductor thin films 14 on Si substrates 12 at temperatures of 20-80° C. above their bulk glass transition temperature ($T_g$). While several materials are observed to form periodic surface structure, as a first example, the disclosure provides a comprehensive analysis in 2,2',2''-(1,3,5-benzinetriyl)-tris(1-phenyl-1-H-benzimidazole) ("TPBi", FIG. 1A), one electron-transporting material used in organic light-emitting devices ("OLED"s). As-deposited films of TPBi appear smooth and featureless, typical of glassy vapor-deposited films. When annealed above $T_g \approx 24°$ C. in the range of 150-185° C., TPBi films crystallize readily and spontaneously form periodic undulations or features 16 (the combination of peaks 18 and valleys 20, defining a height H in film thickness T, see FIG. 1J) perpendicular to the growth direction (see, e.g., FIGS. 1A-1H, 1J).

The pattern periodicity, d, increases monotonically with annealing temperature, ranging from (1.20±0.05) µm at 155° C. to (1.48±0.05) µm at 175° C. for a 30-nm-thick film (FIGS. 1E-1H and FIG. 2C). In the range of 160-175° C., the crystal feature growth front is smooth and continuous, resulting in a highly aligned grating topography with millimeter-sized grains (FIGS. 1C-1D). At higher temperatures (180° C., FIG. 1J), transformation of the film 14 occurs more rapidly along an uneven growth front producing more disordered structures or features 16. Below 160° C., corrugation along certain growth directions is occasionally interrupted by plateaus (155° C., FIG. 1E). Films annealed below 150° C. instead were observed to show faceted growth rings with irregular spacings, similar to structures previously observed in rubrene. This transition from periodic topography to growth rings at lower temperatures suggests that both surface features arise from the same physical mechanism.

Two crystalline phases of TPBi can form over the temperature range of interest. The phase which shows periodic corrugation forms relatively smooth, platelet-like grains (FIG. 1D) and covers >90% of the film surface at annealing temperatures below 170° C. and above ~180° C. A second phase which has a dendritic morphology and significant roughness becomes more dominant between 170° C. and 180° C. with surface coverages ranging from 20-80% (FIGS. 1K-1M). Diffraction of visible light can also be observed in these images, illustrating that the periodic surface structures have nearly complete surface coverage in the platelet-like grains. It is worth noting that these crystals are not spherulites, in contrast to banded spherulites. As shown in FIG. 1D and in FIG. 3A, extinction in cross-polarized optical micrographs is uniform within a crystalline grain, indicating that these platelet-like grains consist of a single crystal orientation.

Figure 2D:
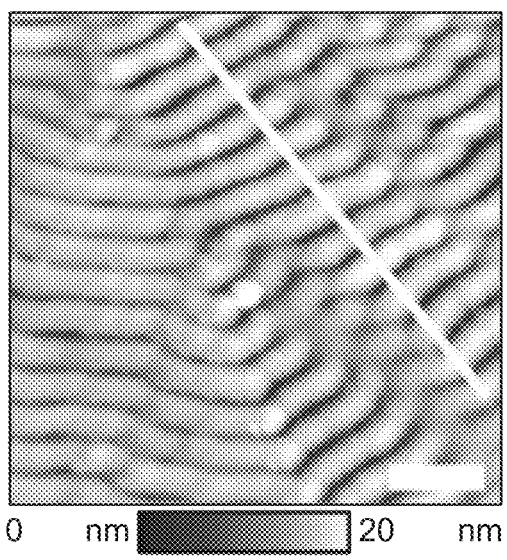
FIG. 2D is an AFM height image of a TPBi film having a thickness of 18 nm on a Si substrate and annealed at 165° C. (scale bar is 2 μm).

The pattern periodicity observed in TPBi shows a roughly linear dependence on film thickness T, ranging from d=(0.83±0.09) µm for an 18-nm-thick film to d=(2.38±0.14) µm for a 47-nm-thick film at a constant temperature of 165° C. (FIG. 2C). The periodicity is determined from fast Fourier transforms (FFTs) of optical micrographs and checked for consistency with measurements from atomic force microscopy ("AFM") images (FIGS. 2D-2G) and diffraction (FIGS. 2A-2B and FIGS. 2H-2L). It is noted that the insets in FIGS. 2A and 2B have the same dimensions. Histograms showing batch-to-batch variability and the distributions used to calculate confidence intervals in FIG. 2C are included in FIGS. 2M-2N. Statistical analysis of pattern quality (i.e. the degree of alignment and order) is also in reference to FIGS. 1E-1H, and the variability in pattern quality is shown and quantified across multiple samples in FIGS. 2O-2T.

Therefore, film thickness T of embodiments of the disclosure can vary. In some embodiments, film thickness T is in the range of about 10 nm to about 100 nm. In some embodiments, film thickness is in the range of 15 nm to 50 nm. In other embodiments, film thickness T is in the range of about 18 nm to about 42 nm. In other embodiments, film thickness T is in the range of about 20 nm to about 35 nm.

Figure 2E:
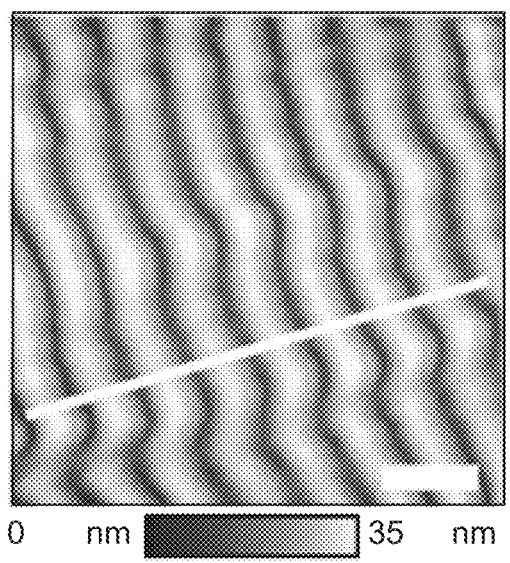
FIG. 2E is an AFM height image of a TPBi film having a thickness of 28 nm on a Si substrate and annealed at 165° C. (scale bar is 2 μm).
Figure 2F:
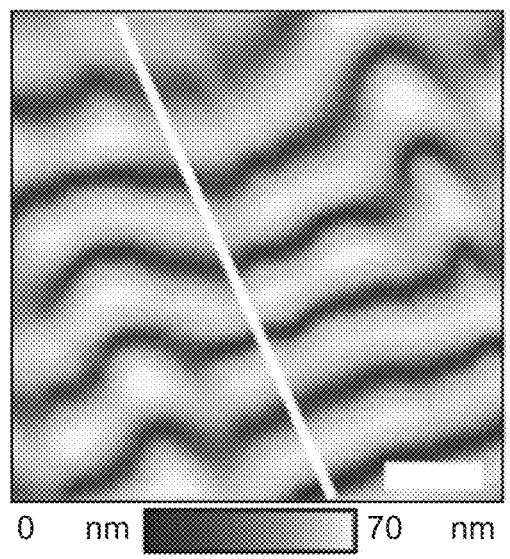
FIG. 2F is an AFM height image of a TPBi film having a thickness of 42 nm on a Si substrate and annealed at 165° C. (scale bar is 2 μm).
Figure 2G:
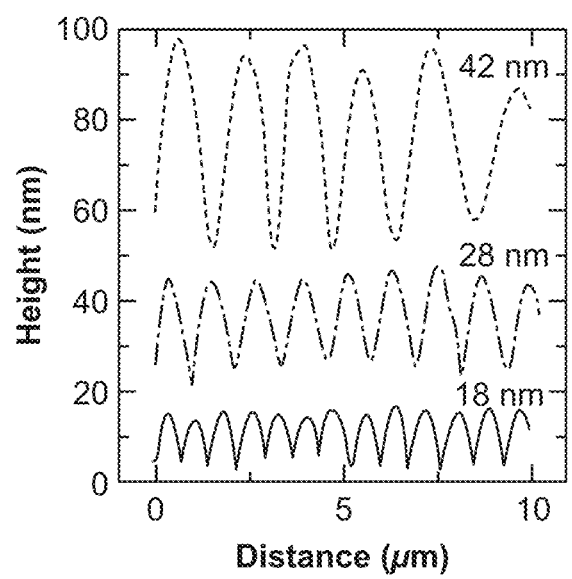
FIG. 2G is a graph illustrating height profiles for the 18-, 28-, and 42-nm-thick TPBi films of FIGS. 2D-2F in which the profiles are vertically offset for clarity (The pattern periodicity extracted from these profiles (0.77 µm, 1.2 µm, and 1.8 µm, respectively) is consistent with measurements from optical microscopy. The average peak-to-valley amplitude extracted from these profiles is 13 nm, 22 nm, and 42 nm, respectively.).
Figure 2O:
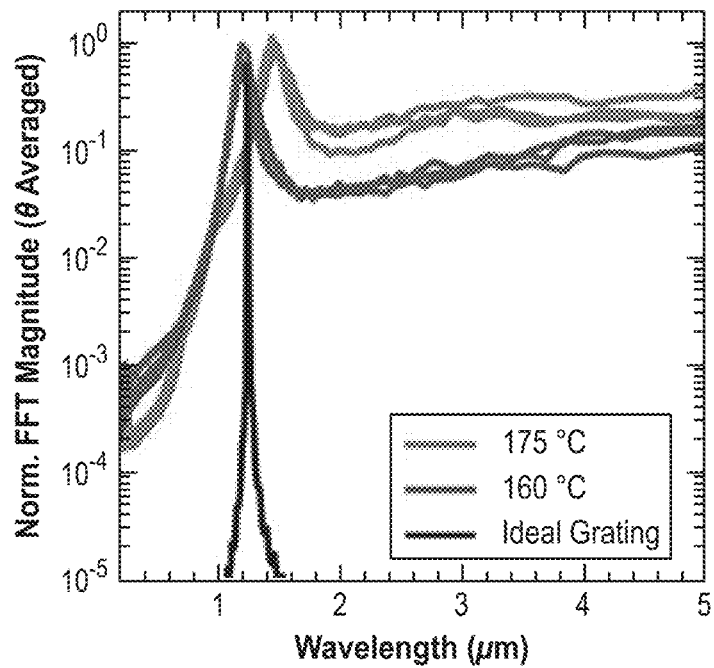
FIG. 2O is a graph of azimuthally-averaged FFT power spectra for 30-nm-thick TPBi films on Si substrates annealed at 160 and 175° C., compared to an ideal sinusoidal grating. As is noted herein, increasing temperature increases the d-spacing, but there is not a large difference in the breadth of the FFT peak. However, there is a considerable increase in the amplitude of the long-wavelength portion of the spectrum at high temperatures, and this portion is attributed to the increased disorder seen at temperatures above 170° C.
Figure 2P:
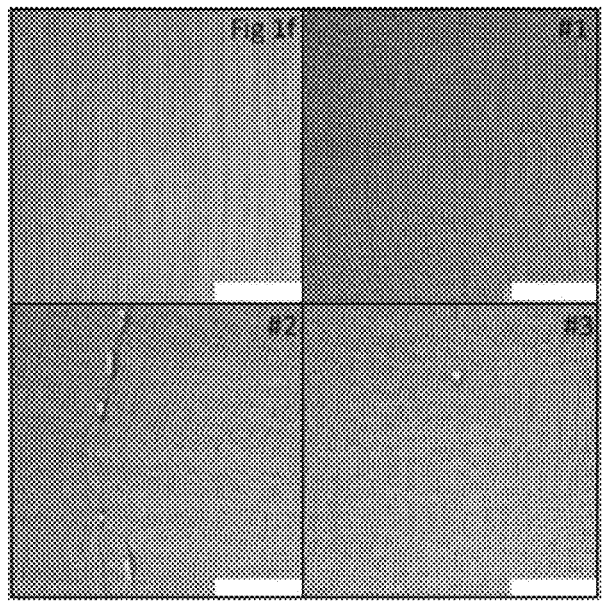
FIG. 2P is an image along ordered (FIG. 1F) and disordered (Images #1-#3) growth directions (scale bars are all 20 µm).
Figure 2Q:
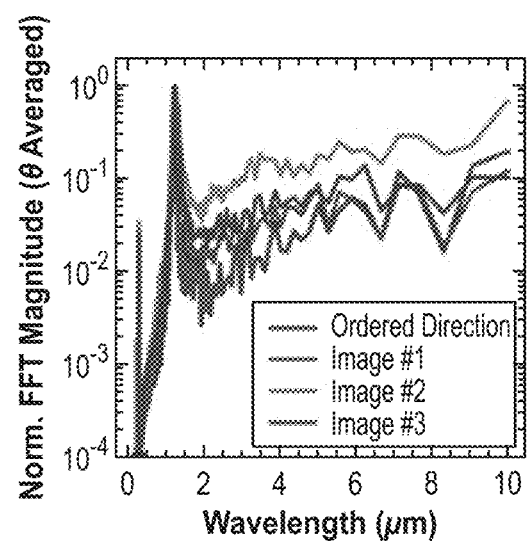
FIG. 2Q is a graph of the normalized FFT magnitude plotted, wherein the region of the FFT spectrum from 2-4 µm corresponds well with the qualitative degree of order of the grating.
Figure 2R:
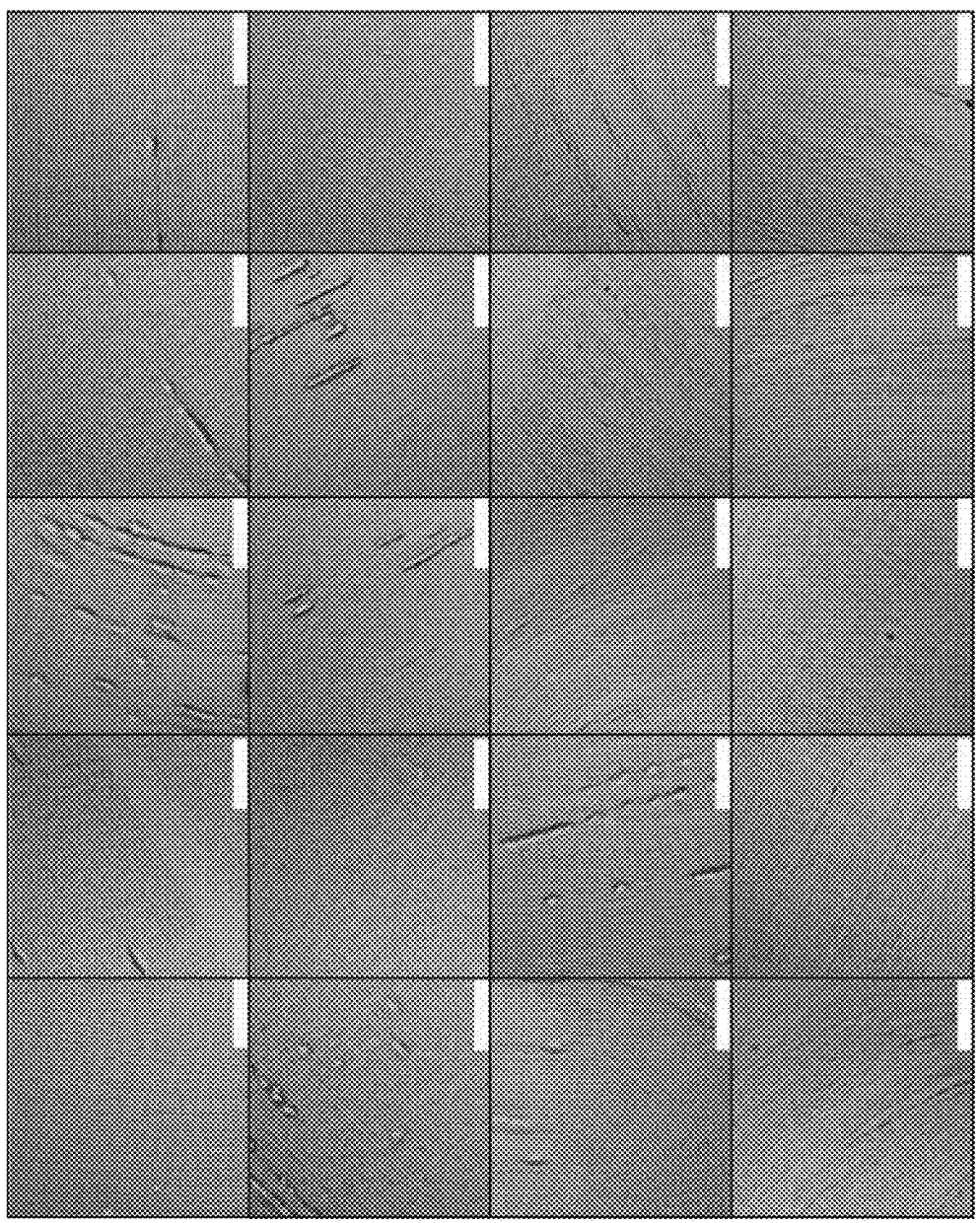
FIG. 2R is a selection of images of 30 nm TPBi film annealed at 163° C. taken across samples from two separate deposition runs. These images are taken semi-randomly, but they are intentionally taken away from grain nucleation sites, as the grating tends to be more disordered and misoriented close to the nucleation site. While they are not truly random samplings of the overall grating quality across a substrate, they do represent the achievable grating quality for samples with large grain sizes (scale bars are all 20 µm).

As another demonstration of the correspondence between pattern disorder and long wavelength FFT magnitude, images for a single sample along ordered and disordered growth directions are compared in FIGS. 2P-2Q. As noted herein and shown in FIG. 3H, the grating becomes more disordered along certain fast-growing directions. This leads to a large long-wavelength magnitude in the FFT spectrum, particularly from 2-4 µm. This region can then be used to compare a large number of images to quantify how representative a given image is of the average grating quality. FIG. 2R shows a selection of images for samples with similar preparation as that in FIG. 1F, and a histogram of the average FFT magnitude from 2-4 µm of these images is included in FIG. 2S (see also, FIG. 2T). These images and the corresponding histogram demonstrate that the grating quality of the image selected in FIG. 1F is reasonably representative, while certain areas are more disordered. Note that images containing multiple orientations of the pattern (e.g. between grains) will also show an elevated FFT magnitude in this range. Hence, to use this as a useful proxy for pattern quality, all selected images are cropped to contain a single pattern orientation.

Under ex situ examination with AFM (FIGS. 2D-2G), the films show well-defined periodicity which is nearly sinusoidal, with wavelengths of (0.77±0.1) (1.2±0.1) µm, and (1.8±0.1) µm for 18-, 28-, and 42-nm-thick films of TPBi annealed at 165° C., in good agreement with the values extracted from optical micrographs. The peak-to-valley amplitude increases with film thickness from (13±1) nm for an 18-nm-thick film, (22±2) nm for a 28-nm-thick film, and to (42±7) nm for a 42-nm-thick film. The total feature depth is nearly as large as the entire film thickness for a 42-nm-thick film, and over 70% of the film thickness for 18- and 28-nm-thick films.

Pattern Formation Mechanism

Figure 3D:
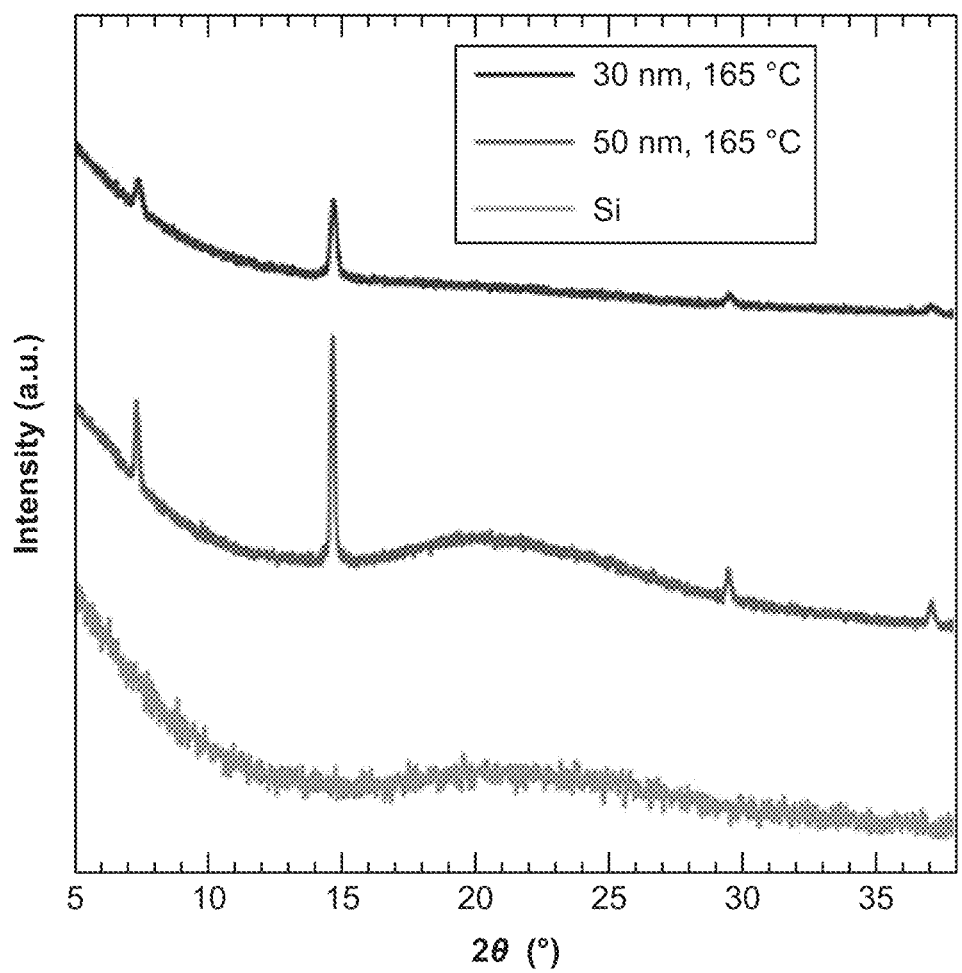
FIG. 3D is a graph of X-ray diffraction patterns taken in the theta-theta geometry for 30- and 50-nm-thick TPBi films annealed at 165° C. on Si substrates, and a background scan on an uncoated Si substrate. Both films show the same peaks and are confirmed to be crystalline. Unannealed, glassy films do not show any diffraction peaks.
Figure 3E:
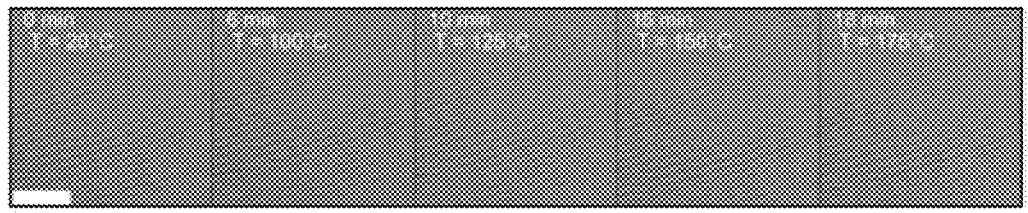
FIG. 3E is an image illustrating thermal stability of 30-nm-thick TPBi films with a temperature ramp from 20° C. to 250° C. over 35 minutes. No change in periodicity is observed over this temperature range, but what appears to be material loss from sublimation begins to consume the film at ~200° C. (Scale bar is 10 µm; Linear contrast stretching was applied to the images to improve visibility of the grating).
Figure 3E:
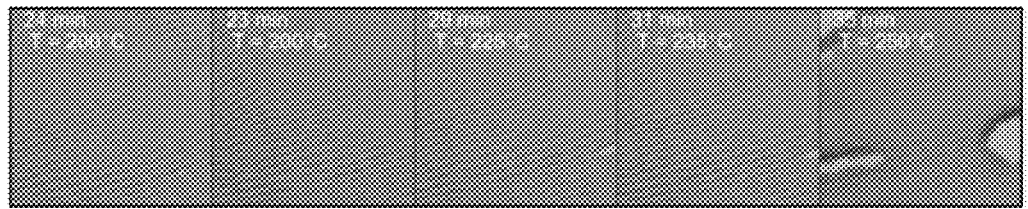
Figure 3F:
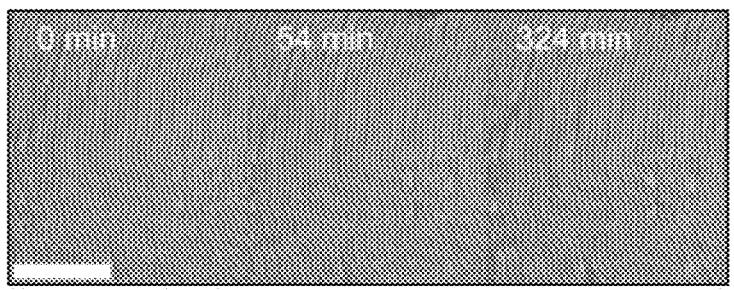
FIG. 3F is an image illustrating thermal stability of 30-nm-thick TPBi films with annealing at 150° C. for 324 minutes. No substantial change in morphology is seen, except for the slow loss of material due to sublimation which proceeds at less than 1 µm per hour (scale bar is 20 µm; histogram equalization was applied to the images to improve visibility of the grating).

To study the formation of these structures, films were imaged in situ during annealing. The time evolution of the growth front for a 30-nm-thick film annealed at 165° C. is shown in FIGS. 3A-3C. The periodic pattern is formed as the crystal growth front progresses (at ~0.6 µm/s), with the ridges/features appearing at the left side of the image window of FIG. 3B and then extending along the length of the growth front. Cross-polarized micrographs on the same film show birefringence contrast progressing simultaneously with the onset of the periodic features, indicating that height variations form concurrently with crystallization (FIG. 3A). Finer time steps are shown in FIG. 3C, showing individual ridges progressing laterally across the growth front at a rate of ~3 µm/s. These time series are taken along the slower-growing crystal facet, suggesting that growth of the crystal along this direction partly occurs via molecular attachment on the faster growing crystal plane. Crystallinity of the transformed material was confirmed with X-ray diffraction (FIG. 3D). Once formed, these patterns show a fixed spacing and are thermally stable, with no significant change in periodicity or morphology after post-annealing for several hours at 150° C. (FIGS. 3E-3F). Thermal stability appears to be limited by sublimation loss.

Figure 3G:
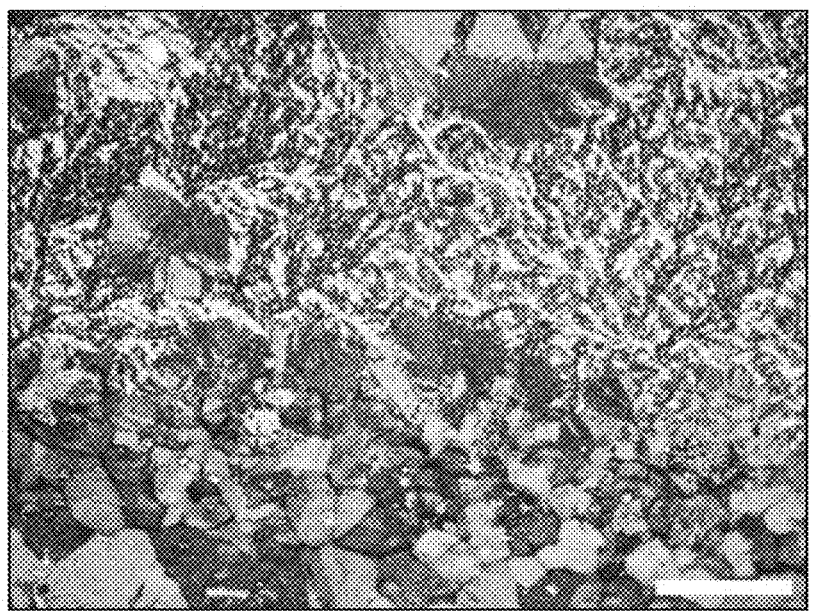
FIG. 3G illustrates disordered morphology of a 60-nm-thick TPBi film on a Si substrate annealed at 160° C. At high thicknesses (>50 nm), pattern quality, surface coverage, and long-range alignment is disrupted by increases in the nucleation density, leading to smaller grains, and increased prominence of the dendritic crystalline phase (scale bar is 100 µm).
Figure 3H:
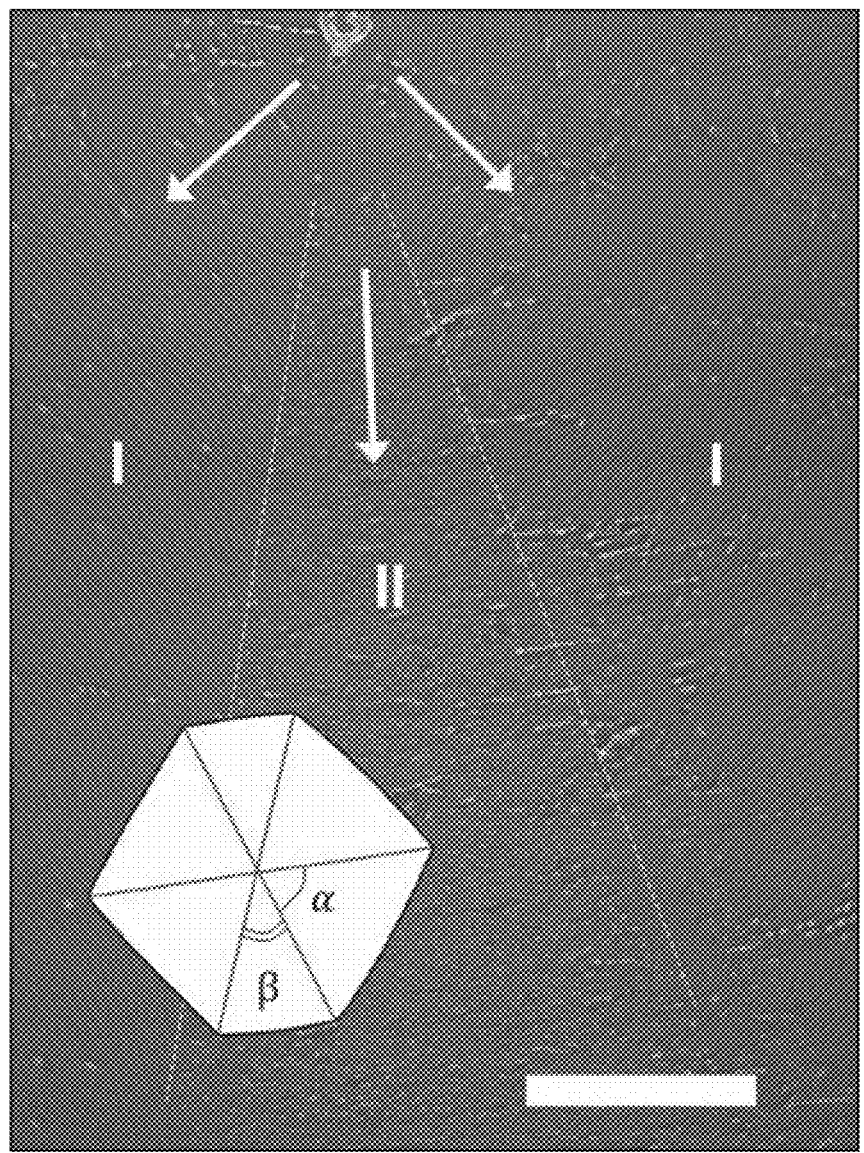
FIG. 3H is an unpolarized optical micrograph of a TPBi film annealed at 180° C., showing growth from the nucleation site (arrows) and areas of periodic (I) and disordered (II) domains. The inset schematic shows a TPBi grain growing, with =75° and =30° for the above film. Regions with a high degree of disorder tends to occur along crystal directions which are oriented to give a more rapid growth rate of individual domains, as in Region II. The dissimilarity in angles and results in Region II growing approximately 20% faster. Film is 30-nm-thick with a 60-nm-thick epitaxial TPBi layer deposited after annealing to improve visibility (scale bar is 50 μm).

Crystal growth rate increases exponentially with temperature and modestly with film thickness, with 40-nm-thick films showing ~30% higher growth rates than 20-nm-thick films. The thickness trend likely arises due to the film-substrate interaction. Correspondingly, the topography or features becomes more disordered with increases in either temperature (FIGS. 1E-1H) or film thickness (FIG. 3G). Higher topography/feature disorder is also observed along the faster-growing facets of TPBi crystals (FIG. 3H), suggesting that pattern quality depends on the transformation front velocity. Growth rate evidently also plays a role in the formation of the smooth regions seen at temperatures below 160° C. (FIG. 1E), as only the slower-growing facets form these plateaus. Absolute growth rates are likely less important than the velocity relative to other kinetic factors, such as the mobility of the supercooled liquid, as fast-growth facets show higher topography/feature disorder across a range of annealing temperatures with growth rates of ~0.5-3 µm/s.

To probe how the surface feature topography forms at the growth front, partially crystallized films were examined ex situ with peak force quantitative nanomechanical (PF-QNM) AFM, which allows amorphous and crystalline regions to be distinguished by their mechanical properties. Stark contrast in adhesion is seen between these regions (FIGS. 4B, 4D), where the amorphous material exhibits greater adhesion, reflecting the increased degrees of freedom for molecular rearrangement and interaction with the tip. Strikingly, the onset of surface height variations does not coincide with the grain boundary, but extends into the surrounding amorphous material by ~0.5 µm (FIGS. 4E-4F) with both significant accumulation and depletion in this region. This indicates that the periodic topography originates here rather than solely in the crystal.

This behavior appears distinct from conventional diffusion-limited crystal growth which is characterized by a depletion zone surrounding the growth front, where only the crystal rises above the height of the neat amorphous material due to upwards growth by surface diffusion. However, these height profiles resemble the damped-oscillation solutions yielded by the Mullins model for surface diffusion and a similar model for viscous surface flow at steady-state, and share features with the depletion and halo regions recently reported during crystallization of isotactic polystyrene. These similarities suggest that this periodic surface topography arises due to a competition between long-range mass transport and crystal growth. The observed height variations could then be explained by a cyclical process which starts with the region near the growth front depleting as growth outpaces long-range mass transport. Growth then slows at high depletion, due to reduced availability of material and increased substrate interactions, allowing mass transport to replenish the depleted region and increase the height of the accumulation region. As the region leading the crystal front thickens, growth will again accelerate and restart the cycle. Mass transport here is likely dominated by viscous flow and not surface diffusion, as annealing is performed 20-60° C. above $T_g$, well above the reported transition between these regimes for common molecular glasses. In other embodiments, the step of annealing is conducted at a temperature in the range of about 10-50% above $T_g$. The role of surface transport in pattern formation is confirmed by experiments employing capping layers to suppress surface molecular motion. Only smooth crystals without periodic topography formed in TPBi film capped with 10-nm-thick films of Au or a high-$T_g$ organic (FIG. 4G).

For these confined films, substrate interactions become important, and hence bulk crystallization and surface crystallization may both be active. Surface crystallization is likely responsible for the formation of depletion and accumulation features, whereas bulk crystallization may continue to drive growth when the depletion depth becomes large and limits the supply of material for surface growth. In capped TPBi films, the crystal growth rate is reduced by 50-90% compared to uncapped films but is not entirely deactivated. This confirms that transport at the free surface is the primary mechanism for feeding crystal growth, but that crystallization in the bulk of the film contributes non-negligibly. Several other effects may contribute to the observed patterns. The volume change upon crystallization may induce stresses in the surrounding amorphous, providing a driving force surface feature formation. Additionally, mobility near the growth front may be periodically enhanced by the release of heat of fusion or from tension arising from crystallization.

With this view of the pattern formation mechanism, the increase in pattern wavelength at higher annealing temperatures may stem from mobility of the supercooled liquid having a steeper function of temperature than the crystal growth rate, allowing flow to occur over a larger distance. This interpretation should lead to some flattening of the pattern features, in qualitative agreement with AFM measurements showing a decreased amplitude at annealing temperatures >175° C. (FIGS. 4L-4P). The dependence of pattern wavelength on thickness could partially be a consequence of the variation in $T_g$ and growth rate with film thickness, and also the total supply of material (i.e. thicker films take longer to deplete, allowing more time for the depletion zone width to increase). The flat regions at low temperatures (FIG. 1E and FIG. 1I) likely form due to mass transport rates matching or exceeding crystal growth, preventing the formation of depletion regions.

Alternative Molecules and Surfaces for Pattern Formation

To enable device integration, it is important to realize patterns in other organic semiconductors and on common electrode surfaces. As many vapor-deposited organic semiconductors form glassy films and crystallize above $T_g$, a variety of materials may be amenable to crystallization-mediated patterning. The present inventors have observed periodic pattern formation in the hole-transport material N,N'-bis(naphthalen-1-yl)-N,N'-bis(phenyl)-benzidine ("α-NPD"), the ambipolar host material 2,2'-bis(4-(carbazol-9-yl)phenyl)-biphenyl ("BCBP"), and the archetypical organic semiconductor rubrene. α-NPD (bulk $T_g$=95° C.) forms a pattern with d=(0.98±0.05) µm for a 30-nm-thick film annealed at 170° C. (FIG. 5A). BCBP (bulk $T_g$=120° C.) forms a pattern with d=(1.6±0.1) µm for a 35-nm-thick film annealed at 170° C. (FIG. 5B). Rubrene crystallizes above ~115° C. and forms a pattern with d=(1.75±0.1) µm for a 30-nm-thick film annealed at 185° C. (FIG. 5C). While the quality and surface coverage of periodic patterns in these materials has not been fully optimized, differences in molecular structure and $T_g$ suggest that the method is generalizable, and that the pattern periodicity could be further tuned by varying materials properties. The formation of these patterns in both electron- and hole-transporting materials also improves the flexibility of this method for device integration.

As a base criterion for feature pattern formation, a candidate material must form a glassy film that transforms to large-area, platelet-like crystals when annealed. However, due to the observed impact of crystal growth rate on pattern quality, it is likely that a balance of kinetic and thermodynamic factors such as $T_g$, steric bulk, and the supercooled liquid viscosity will determine whether surface structure will form upon crystallization. Crystal structure does not appear to impact whether periodic topography forms during crystallization. The phase of rubrene here has an orthorhombic crystal structure, whereas α-NPD is most likely triclinic. The thin-film crystal structures of BCBP and TPBi are not believed to have been reported.

To inform device integration and assess the potential for direct pattern formation on electrode surfaces, TPBi films were deposited and annealed on a variety of surfaces. The present inventors observed pattern formation on electrode materials such as indium tin oxide ("ITO"), gold (Au), and silver (Ag) (FIGS. 5D-5F), as well as other substrates, such as aluminum oxide ($Al_2O_3$), quartz, glass, and tungsten trioxide ($WO_3$)-coated Si (FIGS. 5G-5K). The present inventors envision that other metal oxide substrate layers can also be utilized. The substrate was observed to impact crystal growth rate, where more hydrophobic substrates decreased the crystal growth rate. The pattern wavelength decreases modestly in substrates with slower crystal growth, possibly reflecting substrate interactions which inhibit molecular motion in the super-cooled liquid and thus lower the depletion zone width. For example, feature growth rate in 34-nm-thick TPBi films is reduced from 0.4 µm/s on Si/SiO$_2$ substrates to 0.15 µm/s on Si/Au substrates, and the pattern wavelength decreases from (1.46±0.05) µm to (1.32±0.05) µm.

Strategies to Improve Control of Pattern Formation

To tailor patterns for arbitrary applications, further control is desired over long-range pattern alignment, pattern quality, and feature depth. Since these patterns form along crystal grain edges, alignment across a sample is limited by grain size. Millimeter-scale domains are achieved here (FIGS. 1C-1D), and could be further expanded by selecting optimal underlayers. However, long-range alignment is not needed for many applications where randomly-oriented periodic structures can be tolerated or even desired. For example, outcoupling enhancement layers for OLEDs often consist of random structures to minimize viewing angle dependences.

Feature pattern quality could be engineered by tuning substrate surface properties to control growth rate. As a demonstration of this strategy, the present inventors compared pattern quality and crystal morphology in TPBi films on Si/SiO$_2$ and Si/Au substrates (FIGS. 7A-7D, Tables 1 and 2 below). The reduced crystal growth rate on Si/Au substrates leads to smoother growth fronts and improved pattern quality across all tested annealing temperatures. Another route is to use low-$T_g$ (e.g., $T_g$≤200° C.) underlayer materials, which have been shown in rubrene to increase grain size, reduce branching, and reduce nucleation of other phases. Additives or mixtures could also be employed to alter crystal growth rate and shape by suppressing molecular attachment to certain crystal facets.

TABLE 1

Tapping Mode (attractive regime) AFM scan parameters for FIGS. 2D-2F.

| Parameter | FIG. 2D | FIG. 2E | FIG. 2F |
|---|---|---|---|
| Scan Size | 10.0 µm | 10.0 µm | 10.0 µm |
| Aspect Ratio | 1 | 1 | 1 |
| Pixel Dimensions | 512 × 512 | 512 × 512 | 512 × 512 |
| Scan Rate | 0.996 Hz | 0.996 Hz | 0.996 Hz |
| Scan Angle | 0.00° | 0.00° | 0.00° |
| Feedback Integral Gain | 1.000 | 1.225 | 1.000 |
| Feedback Proportional Gain | 5.000 | 5.000 | 5.000 |
| Amplitude Setpoint | 362.3 mV | 334.2 mV | 379.9 mV |
| Drive Frequency | 268.3 Hz | 260.0 Hz | 268.3 Hz |
| Drive Amplitude | 10.4 mV | 15.6 mV | 9.2 mV |

| Cantilever Type | NanoWorld Arrow ™ NCR |
|---|---|
| Cantilever Resonance Frequency (nominal) | 285 Hz |
| Cantilever Spring Constant (nominal) | 42 N/m |
| Cantilever Length | 160 µm |
| Cantilever Mean Width | 45 µm |
| Cantilever Thickness | 4.6 µm |

TABLE 2

Peak Force Quantitative Nanomechanical AFM scan parameters for FIGS. 4A-4D.

Figures 4A, 4B:
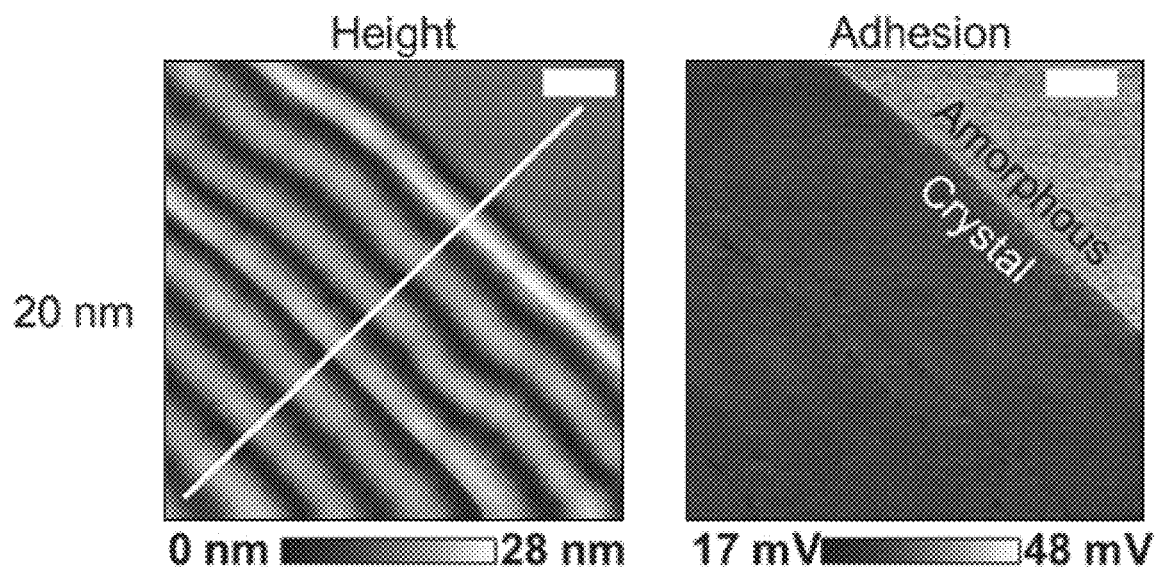
FIG. 4A is a topography height image acquired with peak force AFM for a 20-nm-thick TPBi film on a Si substrate annealed at 163° C. (scale bar is 1 μm).
FIG. 4B is an adhesion image acquired with peak force AFM for a 20-nm-thick TPBi film on a Si substrate annealed at 163° C. (scale bar is 1 μm).
Figures 4C, 4D:
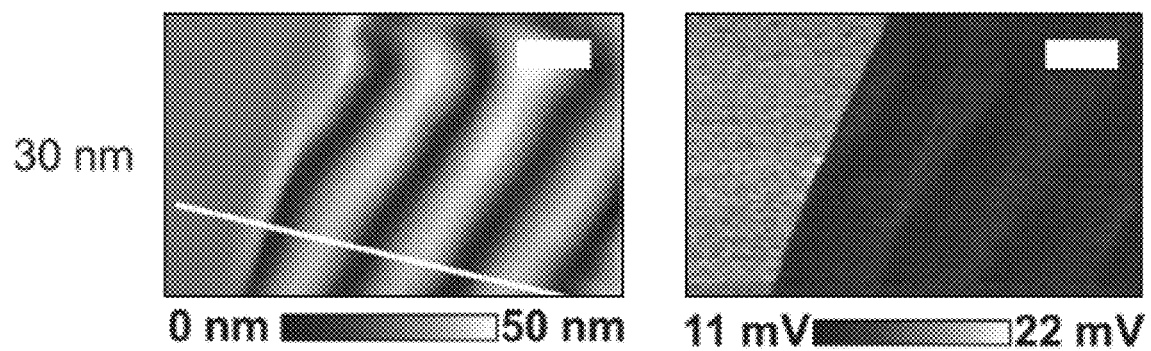
FIG. 4C is a height topography image acquired with peak force AFM for a 30-nm-thick TPBi on a Si substrate annealed at 165° C. (scale bar is 1 μm).
FIG. 4D is an adhesion image acquired with peak force AFM for a 30-nm-thick TPBi film on a Si substrate annealed at 165° C. (scale bar is 1 μm).
Figure 4E:
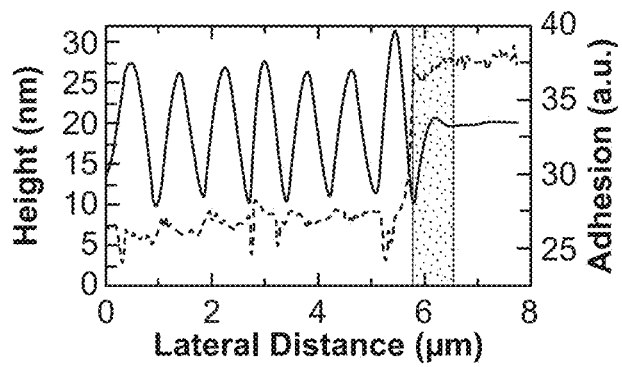
FIG. 4E is a graph illustrating the height profile across the crystal growth front for 20- and 30-nm-thick TPBi films (The white lines in FIG. 4A and FIG. 4C correspond to the center lines for the height profile plotted in FIG. 4E, with profiles averaged laterally over 10 pixels in the perpendicular direction. The shaded region in FIG. 4E highlights the portion of the amorphous region near the crystal growth front which shows both accumulation and depletion of material.).
Figure 4F:
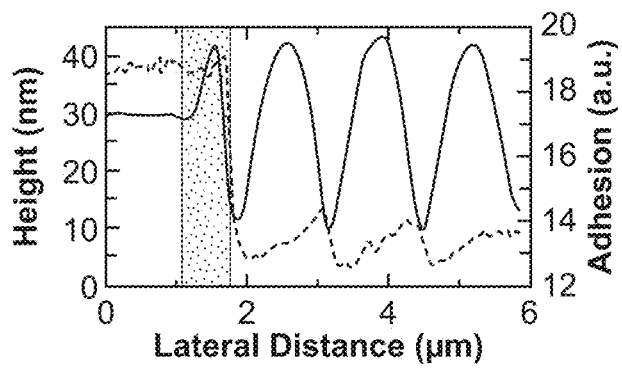
FIG. 4F is a graph illustrating the adhesion profile across the crystal growth front for 20- and 30-nm-thick TPBi films (The white lines in FIG. 4A and FIG. 4C correspond to the center lines for the adhesion profile plotted in FIG. 4f, with profiles averaged laterally over 10 pixels in the perpendicular direction. The adhesion image provides contrast between crystalline and untransformed amorphous regions, due the difference in mechanical properties of the two phases. The shaded region in FIG. 4F highlights the portion of the amorphous region near the crystal growth front which shows both accumulation and depletion of material).
Figure 4G:
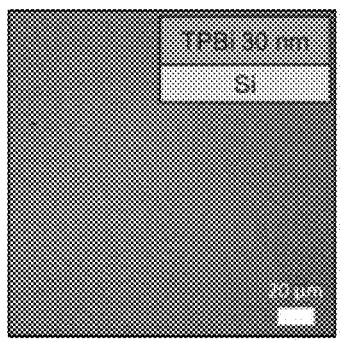
FIG. 4G is a polarized optical micrograph of a 30-nm-thick TPBi film on Si, substrate.
Figure 4H:
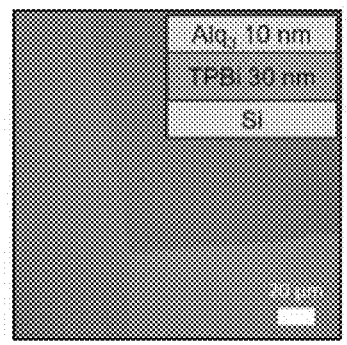
FIG. 4H is a polarized optical micrograph of a 30-nm-thick TPBi film on Si substrate with a 10-nm-thick capping layer of Tris-(8-hydroxyquinoline)aluminum ($Alq_3$), a high-$T_g$ small molecule.
Figure 4I:
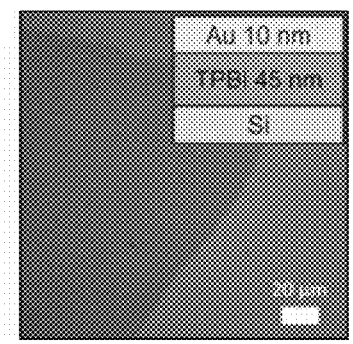
FIG. 4I is a polarized optical micrograph of a 45-nm-thick TPBi film on Si substrate with a 10-nm-thick capping layer of Au. All samples in the images of FIGS. 4G-4I were annealed at 170° C., but the absence of pattern formation was confirmed over a larger range of temperatures from 160° C.-190° C. Nearly no pattern formation or diffraction is observed in capped samples, supporting the hypothesis that pattern formation results from surface-fed crystal growth which depletes the amorphous region surrounding the crystal front.
Figure 4J:
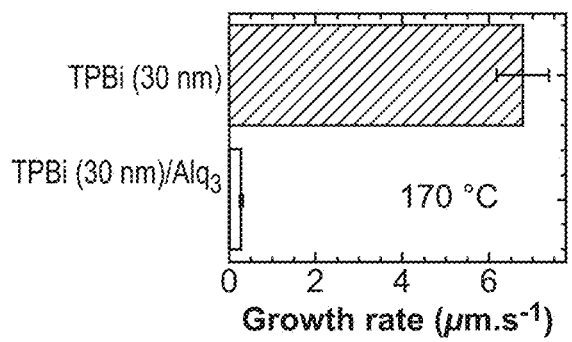
FIGS. 4J-4K are graphs illustrating average crystal growth rate in uncapped and capped films of TPBi. Capped films show suppressed crystal growth rate, confirming that crystal growth is primarily fed by surface transport, yet crystallization via bulk transport still contributes. Error bars represent standard deviations over at least five growth rate measurements.
Figure 4K:
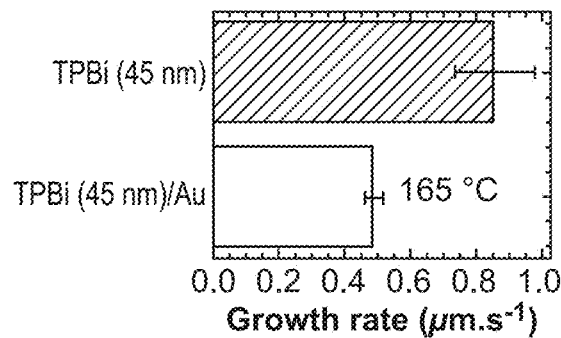
Figures 4L, 4M, 4N:
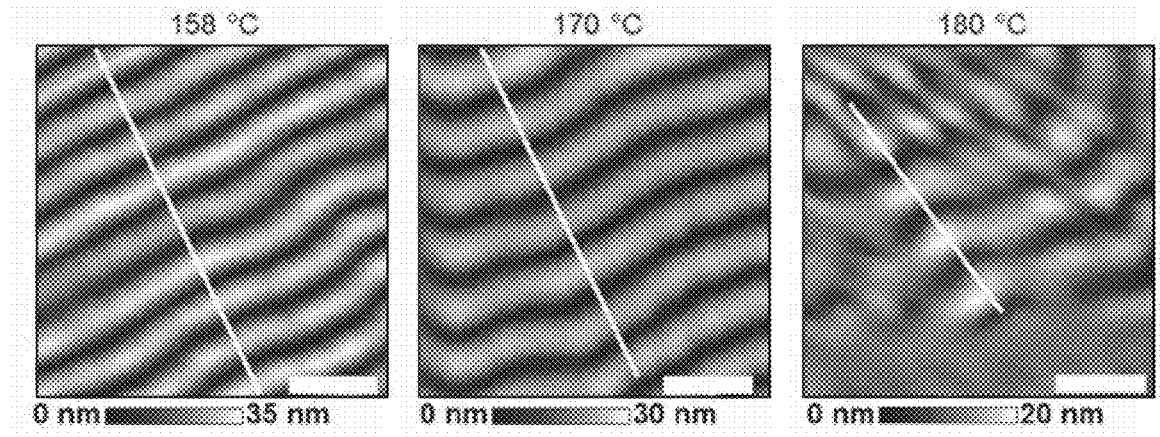
FIG. 4L is an AFM image of 30-nm-thick TPBi film on a Si substrate annealed at 158° C. (Scale bar is 2 μm and white line indicates position of the height profile plotted in FIG. 4O. Profiles are vertically offset for clarity.).
FIG. 4M is an AFM image of 30-nm-thick TPBi film on a Si substrate annealed at 170° C. (Scale bar is 2 μm and white line indicates position of the height profile plotted in FIG. 4O. Profiles are vertically offset for clarity.).
FIG. 4N is an AFM image of 30-nm-thick TPBi film on a Si substrate annealed at 180° C. (Scale bar is 2 μm and white line indicates position of the height profile plotted in FIG. 4O. Profiles are vertically offset for clarity.).
Figure 4O:
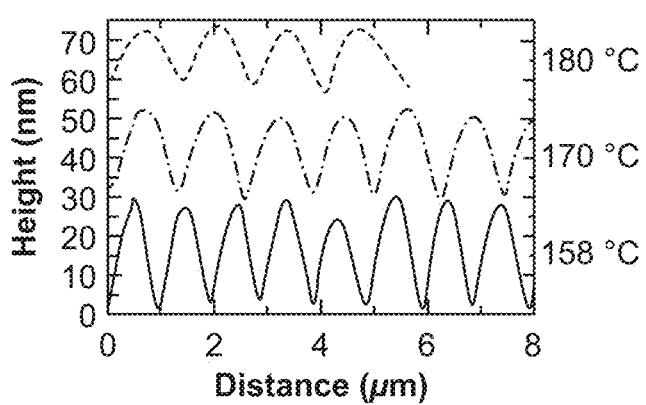
FIG. 4O is a graph illustrating average peak-to-valley height taken across 3-4 images at each temperature.
Figure 4P:
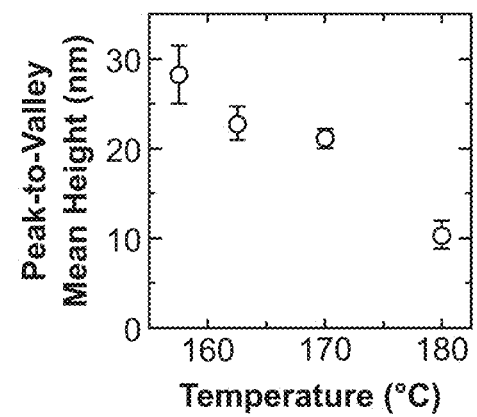
FIG. 4P is a graph illustrating error bars are 95% confidence intervals using the Student's t-distribution for small sample sizes (The pattern wavelength is found to systematically increase with temperature and the peak-to-valley height decreases. As discussed herein, these trends likely result from the mobility of the supercooled liquid increasing more steeply with temperature than the crystal growth rate, allowing flow to occur over a larger distance and leading to flattening of the pattern features.).

| Parameter | FIGS. 4A-4B | FIGS. 4C-4D |
|---|---|---|
| Scan Size | 6.45 µm | 16.6 µm |
| Aspect Ratio | 1 | 1 |
| Pixel Dimensions | 512 × 512 | 400 × 400 |
| Scan Rate | 0.8 Hz | 0.4 Hz |
| Peak Force Setpoint | 4 nN | 4 nN |
| Feedback Gain | 22 | 15 |
| Peak Force Amplitude | 150 nm | 150 nm |
| Peak Force Frequency | 2000 Hz | 2000 Hz |
| Z-Limit | 1 µm | 1 µm |

| Cantilever Type | HQ:NSC36/AL BS |
|---|---|
| Cantilever Spring Constant (nominal) | 0.6 N/m |
| Tip Radius | 8 nm |
| Tip Half Angle | 20° |
| Cantilever Length | 130 µm |
| Cantilever Mean Width | 32.5 µm |
| Cantilever Thickness | 1.0 µm |

Feature depths of at least 70 nm are typically desired for optoelectronic applications. One strategy to achieve larger amplitudes is to improve the quality of pattern formation in thicker films using the above methods. As feature depth can exceed 90% of the film thickness, sufficient depths can be obtained in ~70-nm-thick films.

In view of the present disclosure, it will be understood that numerous materials can be used for substrate 12. In some embodiments, the material forming substrate 12 includes aromatic small molecules containing benzimidazole, benzidine, carbazole, biphenyl, or acene sub-units.

In summary, aspects of the disclosure relate to a crystallization-mediated mechanism for the spontaneous formation of highly-aligned periodic structures in organic semiconductor thin films. These features develop during annealing along the periphery of the crystal growth front, likely due to competition between crystal growth and surface mass transport, and are quickly incorporated into the crystal grain, producing a sinusoidal surface topography. It is envisioned that the wavelength of these structures can be widely tuned from 300 nm to 2,400 nm by varying the film thickness. These patterns are thermally stable and can form on a variety of electrode materials, enabling direct integration into optoelectronic devices. Multiple glassy organic semiconductors are found to form these periodic patterns, suggesting that methods of the disclosure could be generally applied to any readily crystallized materials. The present inventors have identified that crystal growth rate is an important factor in determining whether periodic patterns will form and the overall pattern quality. Due to its simplicity, this phenomenon can be exploited for low-cost lithography-free patterning and provides improved assembly methods for nanostructured organic optoelectronics.

EXAMPLES

TPBi, α-NPD, BCBP, and rubrene were purchased from Luminescence Technology Corp. and used as received (sublimed grade). All films were manufactured using high-vacuum (<10$^{-6}$ Torr) thermal evaporation at a deposition rate of 1 Å/s. Silicon substrates having a 2-nm-thick native oxide layer and were exposed to a UV-ozone ambient for 10 minutes prior to deposition and remained at ambient (25° C.) temperature during deposition. Film thicknesses were measured with variable angle spectroscopic ellipsometry. Annealing was initiated by placing a substrate onto a home-built temperature-controlled microscope stage purged with nitrogen and pre-heated at the annealing temperature. Episcopic optical micrographs were taken with polarized light using a Lumenera Infinity 1.0 camera. To improve visibility of the periodic pattern, histogram equalization was applied to the images in FIG. 1G, FIGS. 2A-2B, and FIG. 5A and linear contrast stretching was applied to all other images using the scikit-image package in Python. Atomic force microscopy was conducted using a Bruker Nanoscope V with a Multimode 8. Images in FIG. 2 and FIGS. 4L-4N were acquired in tapping mode, attractive regime, and AFM cantilevers were aluminum-coated highly doped monolithic silicon with a nominal spring constant of 42 N/m. The image in FIG. 3A was acquired in PF-QNM mode, and AFM cantilevers were aluminum-coated n-type silicon with a nominal force constant of 0.6 N/m. Periodicity in optical microscopy and AFM images was measured using a Fast Fourier Transform (FFT) using the Python package SciPy and Gwyddion. Optical diffraction measurements were performed at normal incidence using a laser with a wavelength of $\lambda$=473 nm having a spot diameter of 0.8 mm, and images were captured on an 8 cm×8 cm screen with a camera length of 9 cm. X-ray diffraction patterns were taken in the theta-theta geometry with a Co Kα source ($\lambda$=0.179 nm).

Figures 8A, 8B, 8C:
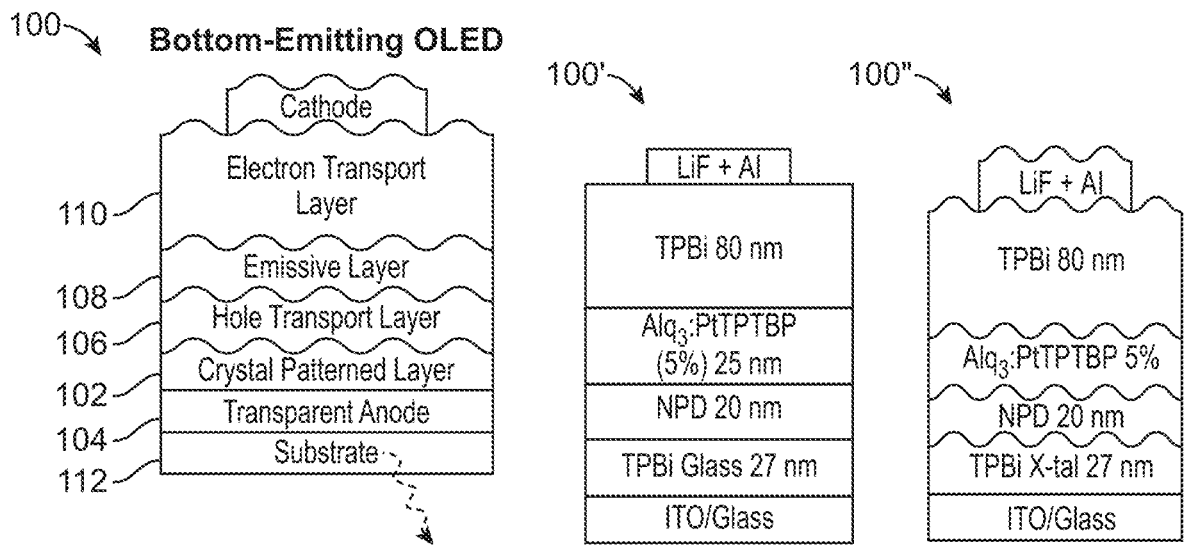
FIG. 8A is a schematic illustration of one example of a bottom-emitting OLED.
FIGS. 8B-8C are control and corrugated device architectures used in assessing impact on outcoupling efficiency of near-infrared OLEDs using Pt (II) meso-tetraphenyl tetrabenzoporphyrine (PtTPTBP) as an emitter. Corrugated devices were fabricated by growing a TPBi film on ITO substrates, annealing at 165° C., and then depositing the remaining layers over top.
Figures 8D, 8E:
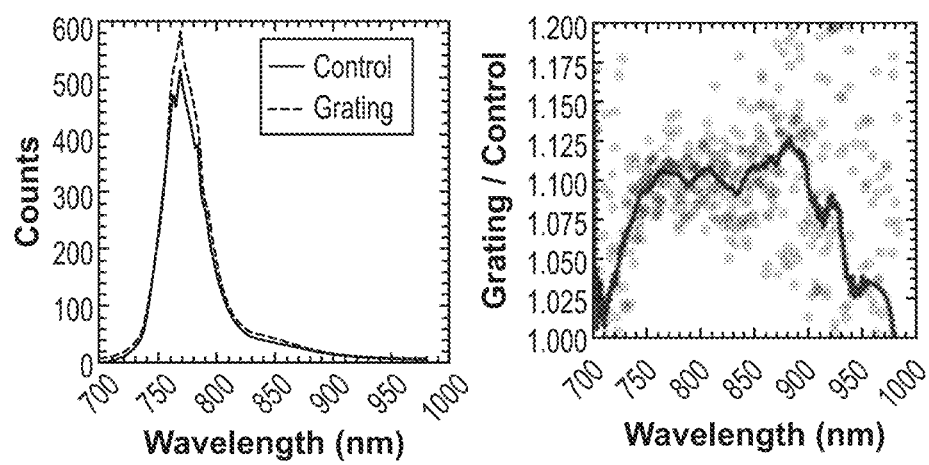
FIG. 8D is a graph illustrating PL intensity for control devices (uncrystallized TPBi) and devices corrugated with crystalline TPBi, pumped by a 405 nm laser at an incident angle of 45°. Semitransparent lines represent individual scans and solid lines are averages over 10 devices.
FIG. 8E is a graph illustrating relative enhancement in PL emission as a function of wavelength. Solid line is a moving average that serves as a guide to the eye. This modest enhancement of 8-10% is consistent with expectations based on literature results for similar architectures with photolithographically patterned corrugation.

FIG. 8A schematically illustrates one example of a device structure for a bottom-emitting OLED 100, the bottom-emitting OLED 100 having a crystal patterned layer 102 grown on top of a transparent anode 104. Other organic layers (hole transport layer 106, emissive layer 108, electron transport layer 110) are grown on top of the patterned layer 102 and propagate the pattern on substrate 112. In this configuration, the crystal patterned layer 102 is electrically incorporated into the device 100 and transports either electrons or holes in the device. The periodic pattern serves to increase the light-outcoupling efficiency of the device. FIGS. 8B-8C illustrate control and corrugated device architectures 100', 100" used in assessing impact on outcoupling efficiency of near-infrared OLEDs using Pt (II) meso-tetraphenyl tetrabenzoporphyrine (PtTPTBP) as an emitter. Corrugated devices were fabricated by growing a TPBi film 102 on ITO substrates 112, annealing at 165° C., and then depositing the remaining layers 106, 108, 110 over top. FIG. 8D is a graph illustrating PL intensity for control devices (uncrystallized TPBi) and devices corrugated with crystalline TPBi, pumped by a 405 nm laser at an incident angle of 45°. Semitransparent lines represent individual scans and solid lines are averages over 10 devices. FIG. 8E is a graph illustrating relative enhancement in PL emission as a function of wavelength. Solid line is a moving average that serves as a guide to the eye. This modest enhancement of 8-10% is consistent with expectations based on literature results for similar architectures with photolithographically patterned corrugation.

Figure 9:
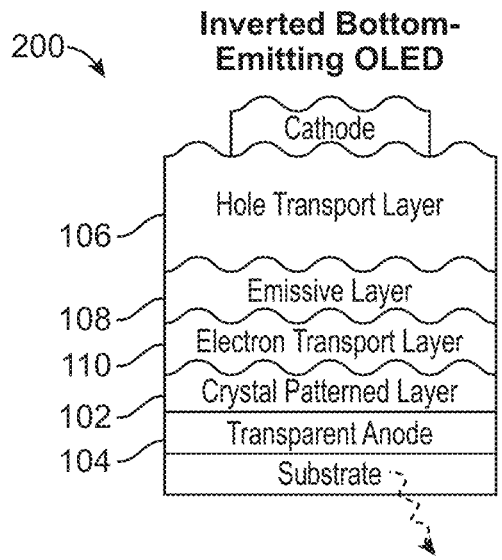
FIG. 9 is a schematic illustration of one example of an inverted bottom-emitting OLED.

Similarly, FIG. 9 schematically illustrates an inverted bottom-emitting OLED 200 that differs only as explicitly disclosed.

Figure 10:
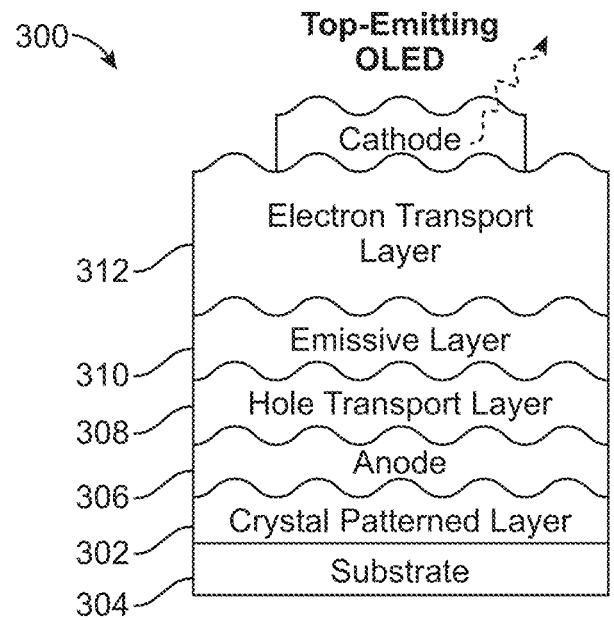
FIG. 10 is a schematic illustration of one example of a top-emitting OLED.

FIG. 10 schematically illustrates one example of a device structure for a top-emitting OLED 300, having the crystal patterned layer 302 grown on top of the substrate 304. An opaque or transparent anode 306 and other organic layers (hole transport layer 308, emissive layer 310, electron transport layer 312) are grown on top of the patterned layer 302 and propagate the pattern. In this configuration, the crystal patterned layer 302 is not electrically incorporated into the device.

Figure 11:
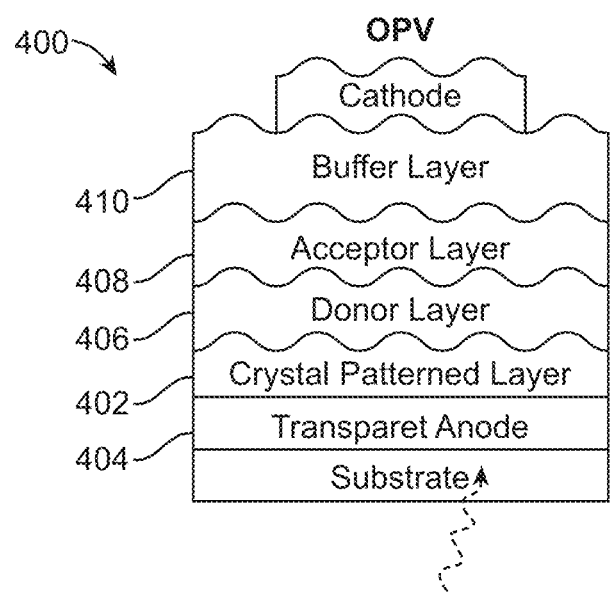
FIG. 11 is a schematic illustration of one example of an organic distributed feedback laser.
Figure 12:
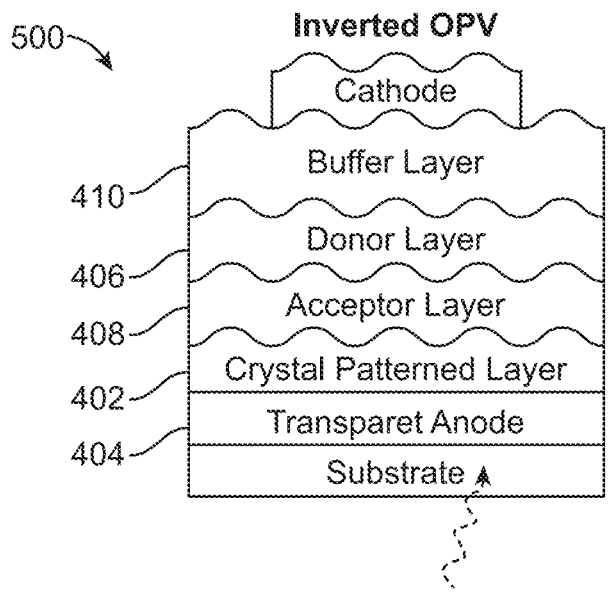
FIG. 12 is a schematic illustration of one example of an inverted organic photovoltaic.

FIG. 11 schematically illustrates one example of a device structure for an organic photovoltaic 400 having a crystal patterned layer 402 grown on top of a transparent anode 404. Other organic layers (donor layer 406, acceptor layer 408, buffer layer 410) are grown on top of the patterned layer 402 and propagate the pattern. In this configuration, the crystal patterned layer 402 is electrically incorporated into the device and transports either electrons or holes out of the device. The periodic pattern serves to trap light within the device and improve the device absorption efficiency. Similarly, FIG. 12 illustrates an inverted organic photovoltaic 500 that differs only as explicitly disclosed.

Figure 13A:
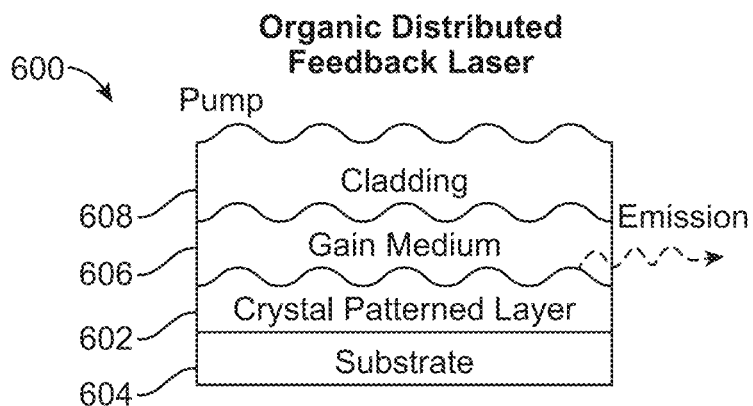
FIGS. 13A-13B are schematic illustrations of organic distributed feedback laser embodiments.
Figure 13B:
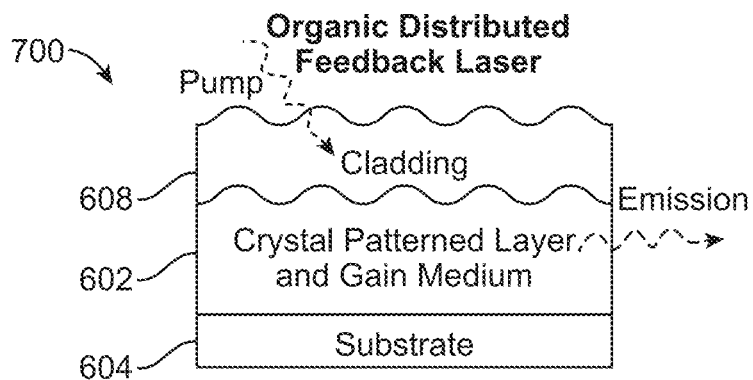

FIGS. 13A-13B schematically illustrate examples of device structures for an organic distributed feedback laser 600, 700, having the crystal patterned layer 602 grown on top of a substrate 604. The gain medium 606 can be deposited on top of the patterned crystal layer (FIG. 13A) or the crystal patterned layer 602 may serve as the gain medium (FIG. 13B). A cladding layer 608 may also be grown on top of the device 600, 700. The periodic pattern provides optical feedback for the laser. The device 600, 700 can be optically pumped by another light source and emit light at another frequency.

Embodiments of the disclosure include a device including a substrate and a crystalline organic semiconductor film formed on the substrate, the crystalline organic semiconductor film including a plurality of features exhibiting a periodicity of 100 nm or more. In some embodiments, the periodicity is in a range of 300 nm to 2,400 nm. In some embodiments the crystalline organic semiconductor film has a thickness and the plurality of features have a peak-tovalley amplitude of at least 60% of the original thickness of the crystalline organic semiconductor film. In some embodiments, the plurality of features have a peak-to-valley amplitude of at least 80% of the original thickness of the crystalline organic semiconductor film. In some embodiments, the crystalline organic semiconductor film is selected from the group consisting of TPBi, α-NPD, BCBP, and rubrene. In some embodiments, the crystalline organic semiconductor film has a thickness in a range of 10 nm to 100 nm. In some embodiments, the organic semiconductor contains aromatic sub-units including benzimidazole, benzidine, carbazole, biphenyl, or acene. In some embodiments, a second organic or nonorganic layer is placed underneath the crystalline organic semiconductor film to engineer crystallinity. In some embodiments, a second organic or nonorganic layer is placed on top of the crystalline organic semiconductor film to propagate the plurality of features.

Embodiments of the disclosure include a device structure for a bottom-emitting organic light emitting diode including one or more of the devices disclosed herein. Other embodiments of the disclosure include a device structure for a top-emitting organic light emitting diode including one or more the devices disclosed herein. Further embodiments of the disclosure include an organic photovoltaic cell including one or more of the devices disclosed herein. Additional embodiments of the discourse include organic distributed feedback lasers including one or more of the devices disclosed herein.

Aspects of the disclosure further include methods comprising providing a substrate; providing an organic semiconductor film and depositing the film on the substrate; and annealing the film until the film crystallizes and exhibits a periodicity of at least 100 nm. In some embodiments, the film crystallizes and exhibits a periodicity in a range of 300 nm to 2,400 nm.

In some methods, the step of annealing is conducted at a temperature in the range of 5-60% above a glass transition temperature (in Kelvin) of the organic semiconductor film. In some methods, the step of annealing is conducted at a temperature in the range of 145 to 185 degrees C. In some methods, the film provided has a thickness in the range of 10 nm to 100 nm. In some methods, the film is selected from the group consisting of TPBi, α-NPD, BCBP, and rubrene. In some embodiments, the substrate includes aromatic small molecules containing benzimidazole, benzidine, carbazole, biphenyl, or acene sub-units. Some methods include the step of depositing a second organic or nonorganic layer underneath the crystalline organic semiconductor film to engineer crystallinity. Some methods include the step of depositing a second organic or nonorganic layer on top of the crystalline organic semiconductor film to propagate the pattern.

Although the present disclosure has been described with reference to preferred embodiments, workers skilled in the art will recognize that changes can be made in form and detail without departing from the spirit and scope of the present disclosure.

What is claimed is:

1. A device including a substrate and a crystalline organic semiconductor film formed on the substrate from an organic semiconductor film, the crystalline organic semiconductor film including a plurality of features, each feature comprising a peak, and exhibiting a periodicity of at least 100 nm, the plurality of features form spontaneously with crystallization of the organic semi-conductor film; the device further including a second organic or nonorganic layer placed underneath the crystalline organic semiconductor film and configured to engineer crystallinity.

2. The device of claim 1, wherein the crystalline organic semiconductor film has an original thickness and the plurality of features have a peak-to-valley amplitude of at least 60% of the original film thickness of the organic semiconductor film.

3. The device of claim 2, wherein the plurality of features have a peak-to-valley amplitude of at least 80% of the original thickness of the organic semiconductor film.

4. The device of claim 1, wherein the crystalline organic semiconductor film is selected from the group consisting of TPBi, α-NPD, BCBP, and rubrene.

5. The device of claim 1, wherein the crystalline organic semiconductor film has a thickness in a range of 10 nm to 100 nm.

6. The device of claim 1, wherein the organic semiconductor contains aromatic sub-units including benzimidazole, benzidine, carbazole, biphenyl, or acene.

7. A device including a substrate and a crystalline organic semiconductor film formed on the substrate from an organic semiconductor film, the crystalline organic semiconductor film including a plurality of features, each feature comprising a peak, and exhibiting a periodicity of at least 100 nm, the plurality of features form spontaneously with crystallization of the organic semi-conductor film; the device further comprising a second organic or nonorganic layer placed on top of the crystalline organic semiconductor film and configured to propagate the plurality of features.

8. The device of claim 7, wherein the crystalline organic semiconductor film has an original thickness and the plurality of features have a peak-to-valley amplitude of at least 60% of the original film thickness of the organic semiconductor film.

9. The device of claim 7, wherein the crystalline organic semiconductor film has a thickness in a range of 10 nm to 100 nm.

10. The device of claim 7, wherein the organic semiconductor contains aromatic sub-units including benzimidazole, benzidine, carbazole, biphenyl, or acene.

11. The device of claim 7, wherein the crystalline organic semiconductor film includes at least two crystalline grains.

12. The device of claim 1, wherein the crystalline organic semiconductor film includes at least two crystalline grains.

* * * * *